(12) United States Patent
Guler et al.

(10) Patent No.: US 12,733,248 B2
(45) Date of Patent: Sep. 8, 2026

(54) GATE LINK ACROSS GATE CUT IN SEMICONDUCTOR DEVICES

(71) Applicant: Intel Corporation, Santa Clara, CA (US)

(72) Inventors: Leonard P. Guler, Hillsboro, OR (US); Shengsi Liu, Portland, OR (US); Saurabh Acharya, Hillsboro, OR (US); Thomas Obrien, Portland, OR (US); Krishna Ganesan, Portland, OR (US); Ankit Kirit Lakhani, Hillsboro, OR (US); Prabhjot Kaur Luthra, Portland, OR (US); Nidhi Khandelwal, Portland, OR (US); Clifford J. Engel, Hillsboro, OR (US); Baofu Zhu, Portland, OR (US); Meenakshisundaram Ramanathan, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 18/125,447

(22) Filed: Mar. 23, 2023

(65) Prior Publication Data

US 2024/0321872 A1 Sep. 26, 2024

(51) Int. Cl.
*H10D 84/83* (2025.01)
*H10D 30/43* (2025.01)
(Continued)

(52) U.S. Cl.
CPC ............ *H10D 84/83* (2025.01); *H10D 30/47* (2025.01); *H10D 30/6735* (2025.01);
(Continued)

(58) Field of Classification Search
CPC ........... H10D 84/0135; H10D 84/0149; H10D 84/038; H10D 84/0144; H10D 84/0151; H10D 30/43
See application file for complete search history.

(56) References Cited

U.S. PATENT DOCUMENTS

2015/0372113 A1* 12/2015 Cheng ................. H10D 64/017 438/700
2018/0138092 A1 5/2018 Lee et al.
(Continued)

OTHER PUBLICATIONS

Extended European Search Report received for EP Application No. 23206291.9, dated Apr. 18, 2024. 13 pages.

*Primary Examiner* — Mohsen Ahmadi
(74) *Attorney, Agent, or Firm* — Arcane Law PLLC

(57) ABSTRACT

Techniques to form an integrated circuit having a gate cut between adjacent pairs of semiconductor devices. At least one of those adjacent pairs of semiconductor devices includes a conductive link (e.g., a bridge) through the gate cut to connect the adjacent gates together. In an example, neighboring semiconductor devices each include a semiconductor region extending between a source region and a drain region, and a gate structure extending over the semiconductor regions of the neighboring semiconductor devices. A gate cut is present between each pair of neighboring semiconductor devices thus interrupting the gate structure and isolating the gate of one semiconductor device from the gate of the other semiconductor device. A conductive link extends over a given gate cut to electrically connect the adjacent gate electrodes together. A dielectric layer extends over the bridged gate electrodes and the conductive link, and may have different thicknesses over those respective features.

18 Claims, 17 Drawing Sheets

(51) Int. Cl.

| | |
|---|---|
| ***H10D 30/47*** | (2025.01) |
| ***H10D 30/67*** | (2025.01) |
| ***H10D 62/10*** | (2025.01) |
| ***H10D 84/01*** | (2026.01) |
| ***H10D 84/03*** | (2025.01) |

(52) U.S. Cl.

CPC ....... *H10D 30/6757* (2025.01); *H10D 62/118* (2025.01); *H10D 84/0135* (2025.01); *H10D 84/0149* (2025.01); *H10D 84/038* (2025.01)

(56) References Cited

U.S. PATENT DOCUMENTS

| | | | | |
|---|---|---|---|---|
| 2021/0202696 | A1* | 7/2021 | Guha .................. | H10D 62/121 |
| 2022/0013410 | A1 | 1/2022 | You et al. | |
| 2022/0093596 | A1* | 3/2022 | Lavric ................ | H10D 84/0181 |
| 2022/0139914 | A1 | 5/2022 | Cheng et al. | |
| 2022/0393013 | A1 | 12/2022 | Guler et al. | |

* cited by examiner

GATE LINK ACROSS GATE CUT IN SEMICONDUCTOR DEVICES

FIELD OF THE DISCLOSURE

The present disclosure relates to integrated circuits, and more particularly, to conductive bridges across gate cuts.

BACKGROUND

As integrated circuits continue to scale downward in size, a number of challenges arise. For instance, reducing the size of memory and logic cells is becoming increasingly more difficult. Certain aspects of lithography technology can impose physical limits on how accurately certain structures can be aligned. Due to the high complexity of integrated circuit layouts, any structures that require additional masking processes or tight alignment tolerances yield possible points of failure for the device. Accordingly, there remain a number of non-trivial challenges with respect to forming such high-density semiconductor devices.

Figure 1A:
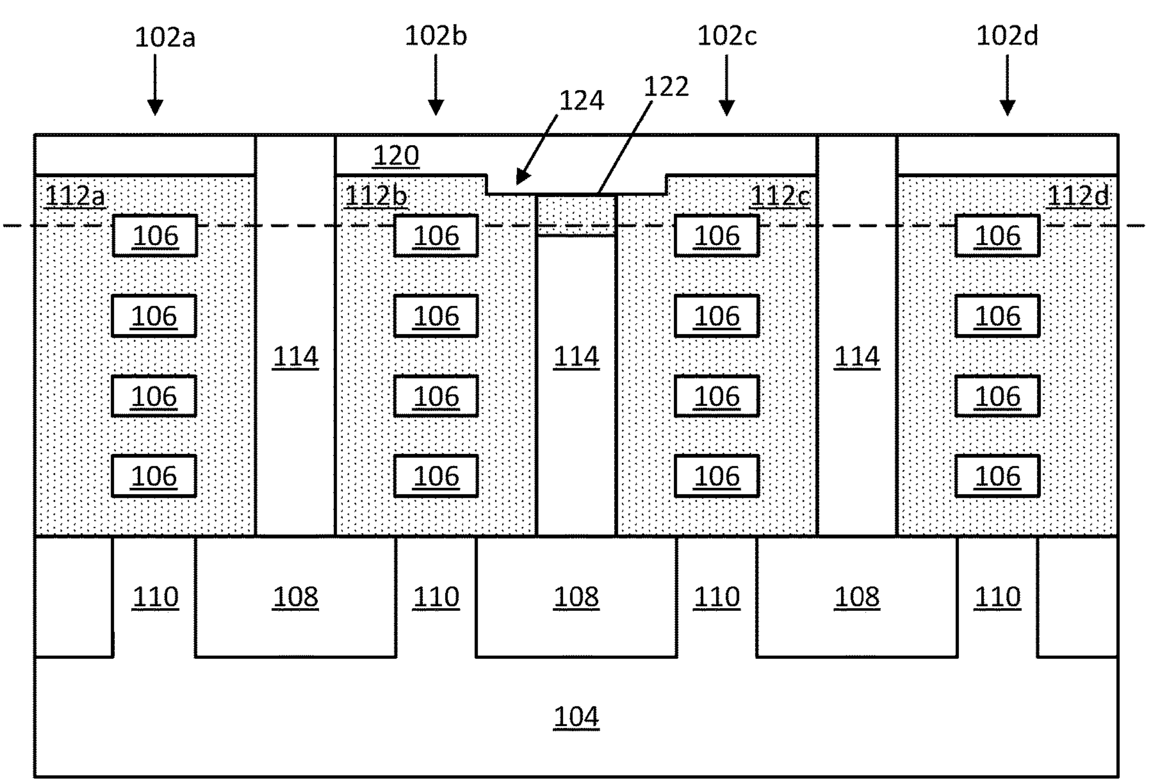
FIG. 1A is a cross-sectional view and FIG. 1B is a plan view of an integrated circuit including a gate link formed between two gate structures that extends between adjacent devices, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used.

DETAILED DESCRIPTION

Techniques are provided herein to form an integrated circuit having an adjacent pair of semiconductor devices separated by a gate cut, and further includes a conductive link (e.g., a bridge) through the gate cut to connect the adjacent gates together. The techniques can be used in any number of integrated circuit applications and are particularly useful with respect to logic and memory cells, such as those cells that use finFETs or gate-all-around transistors (e.g., ribbonFETs and nanowire FETs). In an example, neighboring semiconductor devices each include a semiconductor region extending between a source region and a drain region, and a gate structure extending over the semiconductor regions of the neighboring semiconductor devices. A gate cut may be present between each pair of neighboring semiconductor devices thus interrupting the gate structure and isolating the gate of one semiconductor device from the gate of the other semiconductor device. Each of the gate cuts may be formed, for example, at the same time in a grid-like pattern across the integrated circuit, or in one or more portions of the integrated circuit. In an embodiment, a conductive link extends over a recessed portion of, or otherwise through, a given gate cut to electrically connect the adjacent gate electrodes together. Numerous variations and embodiments will be apparent in light of this disclosure.

General Overview

As previously noted above, there remain a number of non-trivial challenges with respect to integrated circuit fabrication. In more detail, gate cuts are sometimes provided between two adjacent semiconductor devices to isolate first and second portions of a gate structure that crosses over each of the adjacent semiconductor devices. Accordingly, a gate cut can be used to isolate the gates of two devices from one another. Forming such specifically located structures can require numerous masking and etching processes that are relatively complex to implement and can compromise the integrity of the integrated circuit. Furthermore, standard gate cuts are contained within the gate trench area, which can lead to potential shorting around the gate cuts.

Thus, and in accordance with an embodiment of the present disclosure, techniques are provided herein to form a grid of gate cuts across an integrated circuit (or a portion thereof) along with one or more gate links between corresponding pairs of semiconductor devices. According to some such examples, forming the gate cuts between each device pair allows for a more streamlined masking and etching process to form the gate cuts through various material types (e.g., the gate cuts may be formed after the metal gates are formed). According to some embodiments, the gate cut between a given pair of adjacent devices may be etched back and the recess may be plugged with a conductive material to bridge the gap between the adjacent gate structures of the adjacent devices. The process may yield a slight indentation or protrusion of a dielectric cap layer over the recessed gate cut that can be observed in the final structure. The conductive bridge between adjacent gate electrodes may have a smaller width (e.g., in the direction parallel to the length of the semiconductor channel regions) compared to the gate electrodes to allow for more alignment tolerance when etching the recess through the gate cut.

According to an embodiment, an integrated circuit includes a first semiconductor device having a first semiconductor region extending in a first direction between a first source region and a first drain region, a second semiconductor device having a second semiconductor region extending in the first direction between a second source region and a second drain region and spaced from the first semiconductor device in a second direction different from the first direction, a gate electrode around each of the first semiconductor region and the second semiconductor region, a dielectric wall between the first semiconductor device and the second semiconductor device, such that the gate electrode extends through a portion of the dielectric wall along the second direction, and a dielectric layer on a top surface of the gate electrode. The dielectric layer has a first thickness above the dielectric wall and a second thickness above the first semiconductor device or the second semiconductor device that is at least 2 nm different from the first thickness.

According to another embodiment, an integrated circuit includes a first semiconductor region extending in a first direction between a first source region and a first drain region, a second semiconductor region extending in the first direction between a second source region and a second drain region and spaced from the first semiconductor region in a second direction different from the first direction, a first gate electrode around the first semiconductor region, a second gate electrode around the second semiconductor region, a dielectric wall between the first gate electrode and the second gate electrode, and a conductive bridge extending through a portion of the dielectric wall along the second direction and contacting the first gate electrode and the second gate electrode. The first gate electrode and the second gate electrode have a first width along the first direction and the conductive bridge has a second width along the first direction that is at least 2 nm less than the first width.

According to another embodiment, a method of forming an integrated circuit includes: forming a first fin comprising first semiconductor material and a second fin comprising second semiconductor material, the first and second fins extending above a substrate and each extending in a first direction; forming a gate electrode extending over the first fin and the second fin in a second direction different from the first direction; forming a first source region at a first end of the first fin and a first drain region at a second end of the first fin; forming a second source region at a first end of the second fin and a second drain region at a second end of the second fin; forming a dielectric layer over the gate electrode; forming a recess through the gate electrode between the first fin and the second fin, the recess further extending in the first direction between the first source region and the second source region and between the first drain region and the second drain region; forming a dielectric material within the recess; recessing a portion of the dielectric material within the recess between the first semiconductor material and the second semiconductor material; forming a conductive material over the dielectric material, the conductive material being within the recess and contacting the gate electrode; and forming a dielectric fill on the conductive material such that the dielectric fill contacts the dielectric layer.

The techniques can be used with any type of non-planar transistors, including finFETs (sometimes called double-gate transistors, or tri-gate transistors), or nanowire and nanoribbon transistors (sometimes called gate-all-around transistors), to name a few examples. The source and drain regions can be, for example, doped portions of a given fin or substrate, or epitaxial regions that are deposited during an etch-and-replace source/drain forming process. The dopant-type in the source and drain regions will depend on the polarity of the corresponding transistor. The gate structure can be implemented with a gate-first process or a gate-last process (sometimes called a replacement metal gate, or RMG, process), or any other gate formation process. Any number of semiconductor materials can be used in forming the transistors, such as group IV materials (e.g., silicon, germanium, silicon germanium) or group III-V materials (e.g., gallium arsenide, indium gallium arsenide).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For instance, in some example embodiments, such tools may indicate the presence of gate cuts between every adjacent pair of semiconductor devices of a given integrated circuit along with one or more gate links or conductive bridges between gate structures of one or more adjacent semiconductor devices. In some other examples, the thickness of a dielectric cap layer over a given adjacent pair of gate electrodes will show a change (either an indent or protrusion) over the recessed gate cut compared to adjacent portions of the dielectric cap layer not over the recessed gate cut.

It should be readily understood that the meaning of "above" and "over" in the present disclosure should be interpreted in the broadest manner such that "above" and "over" not only mean "directly on" something but also include the meaning of over something with an intermediate feature or a layer therebetween. Further, spatially relative terms, such as "beneath," "below," "lower," "above," "upper," "top," "bottom," and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A monolayer is a layer that consists of a single layer of atoms of a given material. A layer can extend over the entirety of an underlying or overlying structure, or may have an extent less than the extent of an underlying or overlying structure. Further, a layer can be a region of a homogeneous or inhomogeneous continuous structure, with the layer having a thickness less than the thickness of the continuous structure. For example, a layer can be located between any pair of horizontal planes between, or at, a top surface and a bottom surface of the continuous structure. A layer can extend horizontally, vertically, and/or along a tapered surface. A layer can be conformal to a given surface (whether flat or curvilinear) with a relatively uniform thickness across the entire layer.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Architecture

FIG. 1A is a cross sectional view taken across a plurality of semiconductor devices 102*a*-102*d*, according to an embodiment of the present disclosure. Each of semiconductor devices 102*a*-102*d* may be non-planar metal oxide semiconductor (MOS) transistors, such as tri-gate or gate-all-around (GAA) transistors, although other transistor topologies and types could also benefit from the techniques provided herein. The examples herein illustrate semiconductor devices with a GAA structure (e.g., having nanoribbons that extend between source and drain regions).

As can be seen, semiconductor devices 102*a*-102*d* are formed over a substrate 104. Any number of semiconductor devices can be formed on or over substrate 104, but four are used here as an example. Substrate 104 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate can be a semiconductor-on-insulator substrate having a desired semiconductor layer over a buried insulator layer (e.g., silicon over silicon dioxide). Alternatively, the substrate can be a multilayer substrate or superlattice suitable for forming nanowires or nanoribbons (e.g., alternating layers of silicon and SiGe, or alternating layers indium gallium arsenide and indium phosphide). Any number of substrates can be used. In some embodiments, substrate 104 is removed from the backside and replaced with one or more backside interconnect layers to provide backside power and signal routing.

Each of semiconductor devices 102*a*-102*d* includes one or more nanoribbons 106 that extend parallel to one another along a direction between a source region and a drain region (e.g., into and out of the page in the cross-section view of FIG. 1A). Nanoribbons 106 are one example of semiconductor regions that extend between source and drain regions. The term nanoribbon may also encompass other similar shapes such as nanowires or nanosheets. The semiconductor material of nanoribbons 106 may be formed from substrate 104. In some embodiments, semiconductor devices 102*a*-102*d* may each include semiconductor regions in the shape of fins that can be, for example, native to substrate 104 (formed from the substrate itself), such as silicon fins etched from a bulk silicon substrate. Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of the illustrated nanoribbons 106 during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches.

As can further be seen, adjacent semiconductor devices are separated by a dielectric fill 108 that may include silicon oxide. Dielectric fill 108 provides shallow trench isolation (STI) between any adjacent semiconductor devices. Dielectric fill 108 can be any suitable dielectric material, such as silicon dioxide, aluminum oxide, or silicon oxycarbonitride.

Semiconductor devices 102*a*-102*d* each include a subfin region 110. According to some embodiments, subfin region 110 comprises the same semiconductor material as substrate 104 and is adjacent to dielectric fill 108. According to some embodiments, nanoribbons 106 (or other semiconductor structures) are present above the top surface of subfin region 110 and provide an active region for each transistor (e.g., the semiconductor region beneath the gate).

As noted above, nanoribbons 106 extend between a source region and a drain region. The source and drain regions are not shown in the cross-section of FIG. 1A. According to some embodiments, the source and drain regions are epitaxial regions that are provided on the ends of the fins or nanoribbons in an etch-and-replace process. In other embodiments one or both of the source and drain regions could be, for example, implantation-doped native portions of the fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. In an example, for instance, one transistor is a p-type MOS (PMOS) transistor, and the other transistor is an n-type MOS (NMOS) transistor. Any number of source and drain configurations and materials can be used.

According to some embodiments, gate structures 112*a*-112*d* extend over nanoribbons 106 of corresponding semiconductor devices 102*a*-102*d*. It should be noted that one or more gate dielectric layers are also a part of each of gate structure 112*a*-112*d* around nanoribbons 106 and are not shown for clarity. Each of gate structures 112*a*-112*d* may include any sufficiently conductive material such as a metal, metal alloy, or doped polysilicon. In some embodiments, the gate structures 112*a*-112*d* include one or more workfunction metals around nanoribbons 106. In some embodiments, semiconductor devices 102*a* and 102*b* are p-channel devices that include a workfunction metal having titanium around its nanoribbons 106 and semiconductor devices 102*c* and 102*d* are n-channel devices that include a workfunction metal having tungsten around its nanoribbons 106. Gate structures 112*a*-112*d* may also include a fill metal or other conductive material around the workfunction metals to provide the whole gate electrode structure.

According to some embodiments, each gate structure 112*a*-112*d* is separated along the second direction by a different gate cut 114, which act like dielectric barriers between gate structures. The gate cuts 114 effectively isolate the gate structures 112*a*-112*d* from one another to form electrically separate gates for each semiconductor device. In the illustrated example, three gate cuts 114 are formed. Gate cuts 114 may be formed from a sufficiently insulating material, such as a dielectric material. Example materials for gate cuts 114 include silicon nitride, silicon oxide, or silicon oxynitride. According to some embodiments, gate cuts 114 each has a width between about 10 nm and about 15 nm.

Figure 1B:
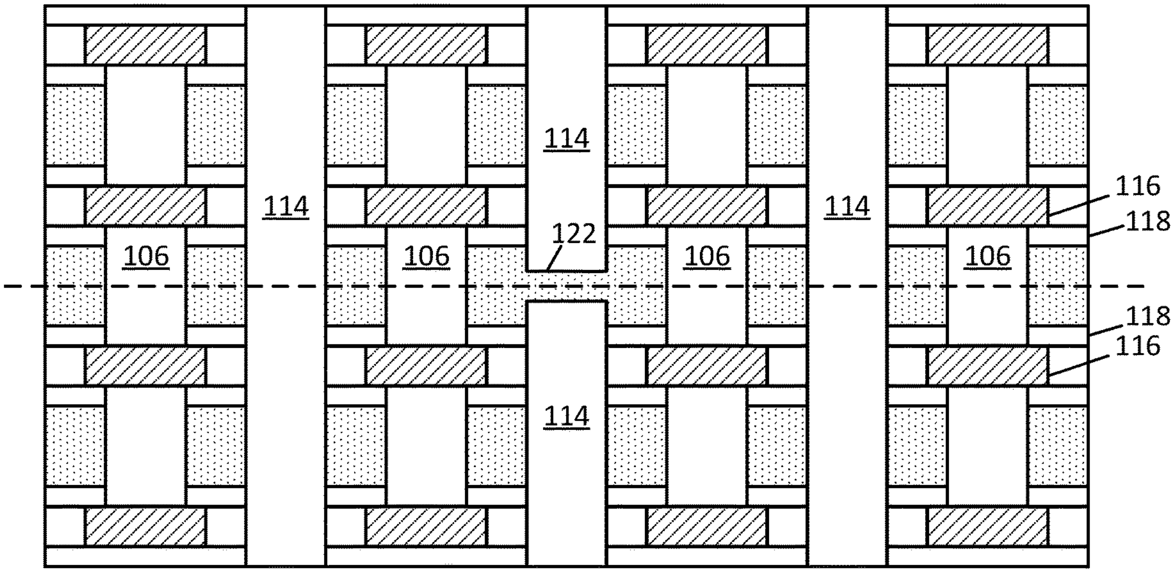

According to some embodiments, gate cuts 114 extend in the first direction (along the length of nanoribbons 106) across the gate trench and further along the source/drain trench to isolate adjacent source or drain regions from each other. In the top-down view illustrated in FIG. 1B, gate cuts 114 can be seen extending across multiple devices to separate gate structures and source or drain regions 116 from one another. Source or drain regions 116 may be formed at the ends of nanoribbons 106 along the source/drain trench between spacer structures 118. According to some embodiments, spacer structures 118 are dielectric structures along the sidewalls of the gate structures. Nanoribbons 106 extend through spacer structures 118 to contact source or drain regions 116. The plan view of FIG. 1B is taken across the dotted line shown in FIG. 1A such that nanoribbons 106 can be seen extending between source or drain regions 116 while FIG. 1A is a cross section taken through the dotted line shown in FIG. 1B. Any of source or drain regions 116 may act as either a source region or a drain region, depending on the application and dopant profile. Any semiconductor materials suitable for source and drain regions can be used (e.g., group IV and group III-V semiconductor materials) for any of the illustrated source or drains regions 116. In any such cases, the composition and doping of source or drain regions 116 may be the same or different, depending on the polarity of the transistors. For example, semiconductor device 102*b* may be a p-type MOS (PMOS) transistor having a high concentration of p-type dopants in the associated source or drain regions 116, and semiconductor device 102*c* may be an n-type MOS (NMOS) transistor having a high concentration of n-type dopants in the associated source or drain regions 116. Any number of source and drain configurations and materials can be used.

According to some embodiments, a dielectric cap 120 is formed over gate structures 112*a*-112*d* to protect the underlying gate structure. Dielectric cap 120 may be any suitable dielectric material, such as silicon nitride, silicon oxide, or silicon oxynitride.

As noted above, gate cuts 114 separate all gate structures from one another along the second direction. In some applications, two adjacent gate structures may want to be connected. Thus, according to an embodiment, a gate link (e.g., a conductive bridge) 122 connects between adjacent gate structures 112*b* and 112*c* over top of a recessed portion of gate cut 114. Gate link 122 may be any suitable conductive material, and may include the same conductive material as the gate electrode material used in either gate structure 112*b* or gate structure 112*c*. As seen in the top-down view of FIG. 1B, only a portion of gate cut 114 extending across the gate trench is recessed to form gate link 122, according to some embodiments. Accordingly, gate link 122 may have a smaller width in the first direction compared to the width in the first direction of either gate structure 112*b* or gate structure 112*c*.

According to some embodiments, dielectric cap 120 exhibits a change in thickness over gate link 112. In the illustrated example, dielectric cap 120 includes a protrusion 124 at least over gate link 122 that has a greater thickness compared to other regions of dielectric cap 120. In other examples, dielectric cap 120 may have a divot or other similar feature such that the thickness of dielectric cap 120 over gate link 122 is thinner compared to other regions of dielectric cap 120.

Fabrication Methodology

FIGS. 2A-13A and 2B-13B are cross-sectional and plan views, respectively, that collectively illustrate an example process for forming an integrated circuit configured with one or more gate links across gate cuts, in accordance with an embodiment of the present disclosure. FIGS. 2A-13A represent a cross-sectional view taken the dotted line shown in the plan view of FIG. 1B, while FIGS. 2B-13B represent the corresponding plan view taken across the dotted line shown in the cross-section view of FIG. 1A. Each figure shows an example structure that results from the process flow up to that point in time, so the depicted structure evolves as the process flow continues, culminating in the structure shown in FIGS. 13A and 13B, which is similar to the structure shown in FIGS. 1A and 1B. Such a structure may be part of an overall integrated circuit (e.g., such as a processor or memory chip) that includes, for example, digital logic cells and/or memory cells and analog mixed signal circuitry. Thus, the illustrated integrated circuit structure may be part of a larger integrated circuit that includes other integrated circuitry not depicted. Example materials and process parameters are given, but the present disclosure is not intended to be limited to any specific such materials or parameters, as will be appreciated. Figures sharing the same number (e.g., FIGS. 2A and 2B) illustrate different views of the structure at the same point in time during the process flow.

Figure 2A:
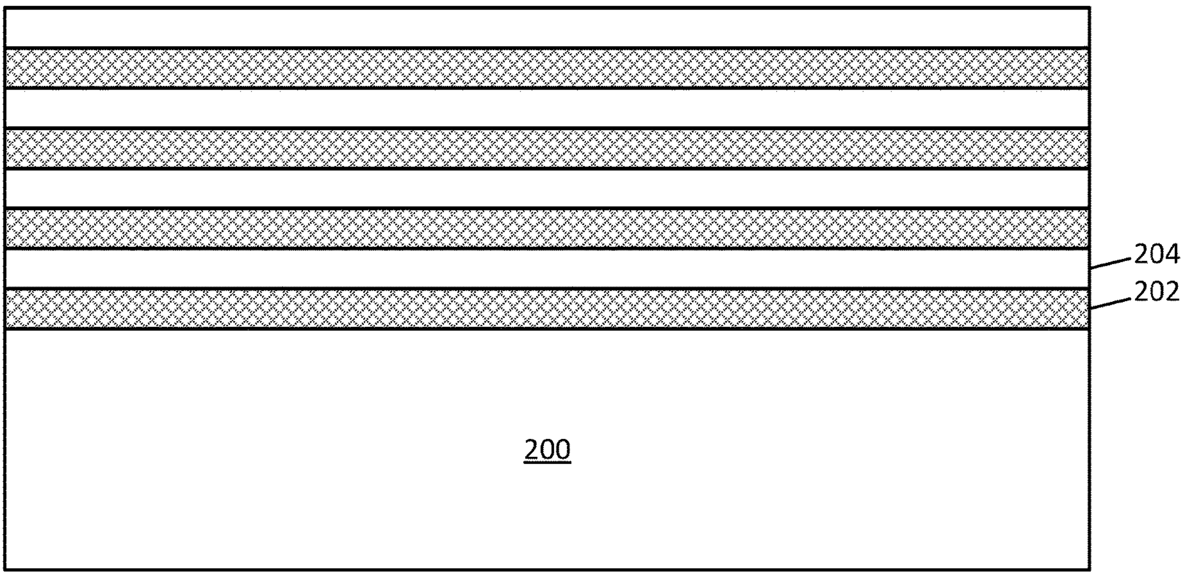
FIGS. 2A and 2B are cross-sectional and plan views, respectively, that illustrate one stage in an example process for forming an integrated circuit configured with a gate link between adjacent gate structures, in accordance with an embodiment of the present disclosure.

FIG. 2A illustrates a cross-sectional view taken through a substrate 200 having a series of material layers formed over the substrate, according to an embodiment of the present disclosure. Alternating material layers may be deposited over substrate 200 including sacrificial layers 202 alternating with semiconductor layers 204. The alternating layers are used to form GAA transistor structures. Any number of alternating semiconductor layers 204 and sacrificial layers 202 may be deposited over substrate 200. The description above for substrate 104 applies equally to substrate 200.

According to some embodiments, sacrificial layers 202 have a different material composition than semiconductor layers 204. In some embodiments, sacrificial layers 202 are silicon germanium (SiGe) while semiconductor layers 204 include a semiconductor material suitable for use as a nanoribbon such as silicon (Si), SiGe, germanium, or III-V materials like indium phosphide (InP) or gallium arsenide (GaAs). In examples where SiGe is used in each of sacrificial layers 202 and in semiconductor layers 204, the germanium concentration is different between sacrificial layers 202 and semiconductor layers 204. For example, sacrificial layers 202 may include a higher germanium content compared to semiconductor layers 204. In some examples, semiconductor layers 204 may be doped with either n-type dopants (to produce a p-channel transistor) or p-type dopants (to produce an n-channel transistor).

Figure 2B:

While dimensions can vary from one example embodiment to the next, the thickness of each sacrificial layer 202 may be between about 5 nm and about 20 nm. In some embodiments, the thickness of each sacrificial layer 202 is substantially the same (e.g., within 1-2 nm). The thickness of each of semiconductor layers 204 may be about the same as the thickness of each sacrificial layer 202 (e.g., about 5-20 nm). Each of sacrificial layers 202 and semiconductor layers 204 may be deposited using any known material deposition technique, such as chemical vapor deposition (CVD), plasma-enhanced chemical vapor deposition (PECVD), physical vapor deposition (PVD), or atomic layer deposition (ALD). FIG. 2B illustrates a plan view taken through the top-most deposited semiconductor layer 204, according to an embodiment.

Figure 3A:
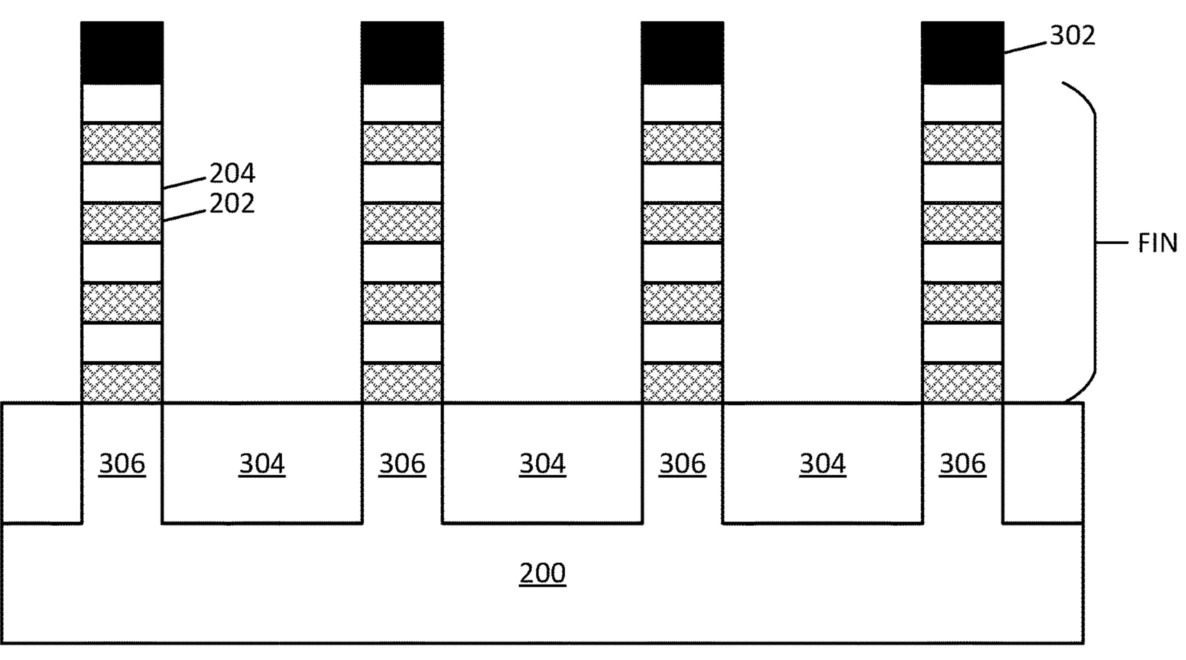
FIGS. 3A and 3B are cross-sectional and plan views, respectively, that illustrate another stage in the example process for forming an integrated circuit configured with a gate link between adjacent gate structures, in accordance with an embodiment of the present disclosure.
Figure 3B:
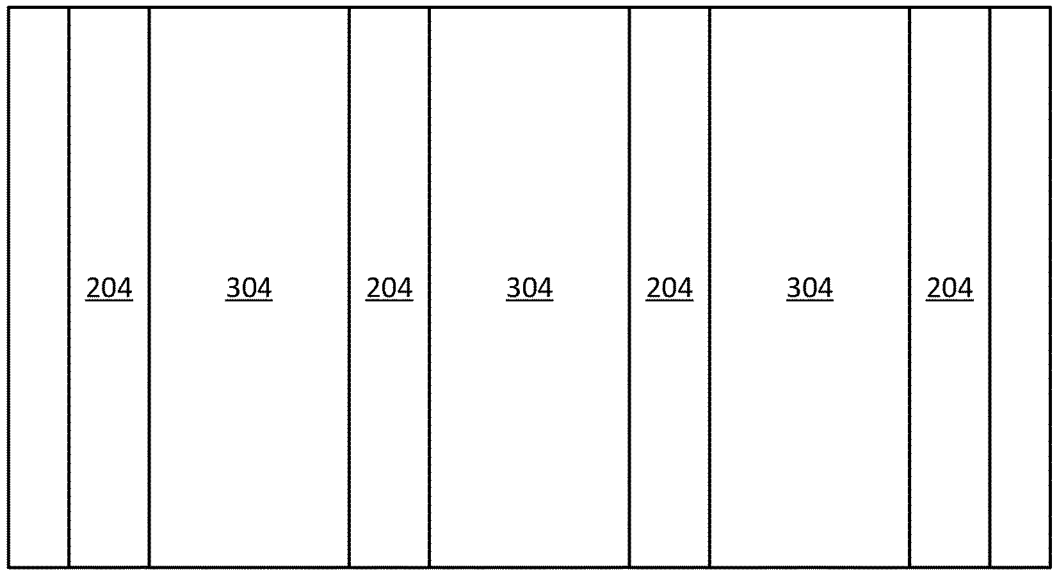

FIGS. 3A and 3B depict the cross-section and plan views of the structure shown in FIGS. 2A and 2B, respectively, following the formation of a cap layer 302 and the subsequent formation of fins beneath cap layer 302, according to an embodiment. Cap layer 302 may be any suitable hard mask material such as a carbon hard mask (CHM) or silicon nitride. Cap layer 302 is patterned into rows to form corresponding rows of fins from the alternating layer stack of sacrificial layers 202 and semiconductor layers 204. The rows of fins extend lengthwise in a first direction.

According to some embodiments, an anisotropic etching process through the layer stack continues into at least a portion of substrate 200. The etched portion of substrate 200 may be filled with a dielectric layer 304 that acts as shallow trench isolation (STI) between adjacent fins. Dielectric layer 304 may be any suitable dielectric material such as silicon oxide. Subfin regions 306 represent remaining portions of substrate 200 between dielectric layer 304, according to some embodiments. FIG. 3B illustrates how dielectric layer 304 extends along the entire length of each of the fins in the first direction, according to some embodiments.

Figures 4A, 4B:
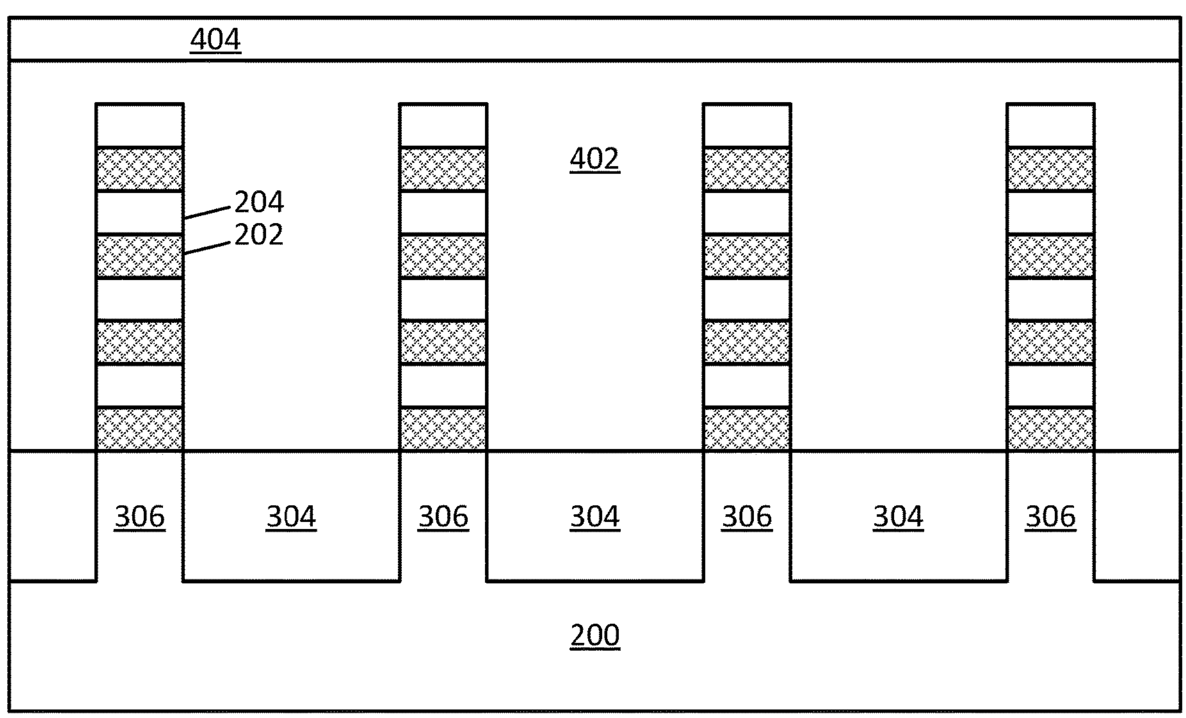
FIGS. 4A and 4B are cross-sectional and plan views, respectively, that illustrate another stage in the example process for forming an integrated circuit configured with a gate link between adjacent gate structures, in accordance with an embodiment of the present disclosure.

FIGS. 4A and 4B depict the cross-section and plan views of the structure shown in FIGS. 3A and 3B, respectively, following the formation of a sacrificial gate 402 beneath a corresponding gate masking layer 404, according to some embodiments. Gate masking layers 404 may be patterned in strips that extend in a second direction (e.g., orthogonally) across each of the fins in order to form corresponding sacrificial gates 402 in strips beneath the gate masking layers 404. According to some embodiments, the sacrificial gate material is removed in all areas not protected by gate masking layers 404. Gate masking layer 404 may be any suitable hard mask material such as CHM or silicon nitride. Sacrificial gate 402 may be any suitable material that can be selectively removed without damaging the semiconductor material of the fins. In some examples, sacrificial gate 402 includes polysilicon.

Figure 5A:
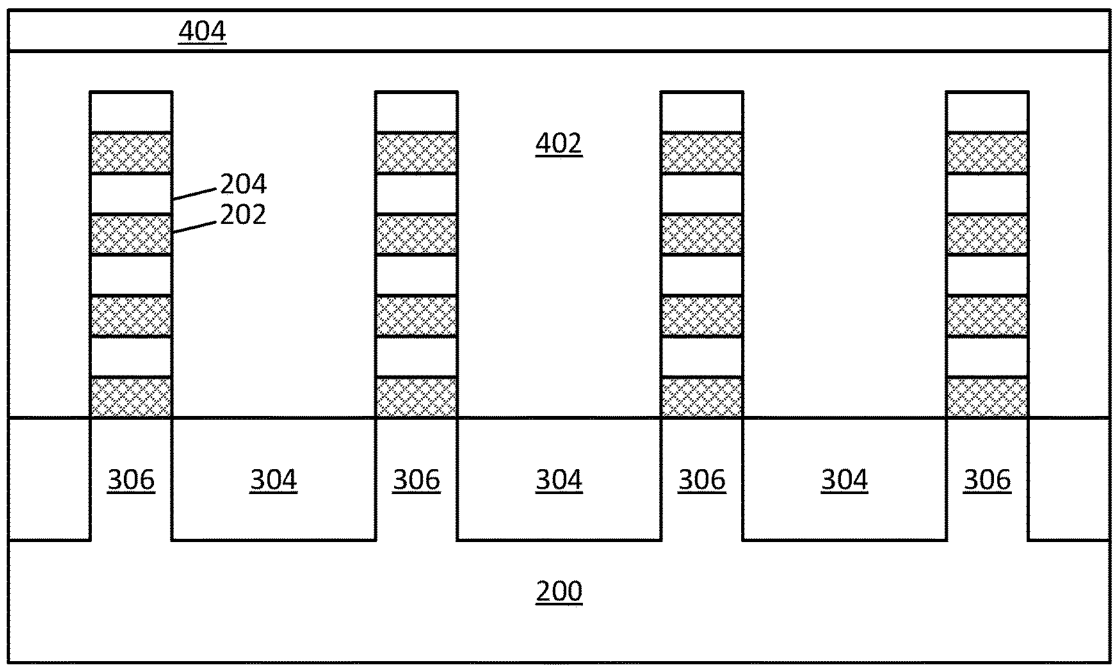
FIGS. 5A and 5B are cross-sectional and plan views, respectively, that illustrate another stage in the example process for forming an integrated circuit configured with a gate link between adjacent gate structures, in accordance with an embodiment of the present disclosure.
Figure 5B:
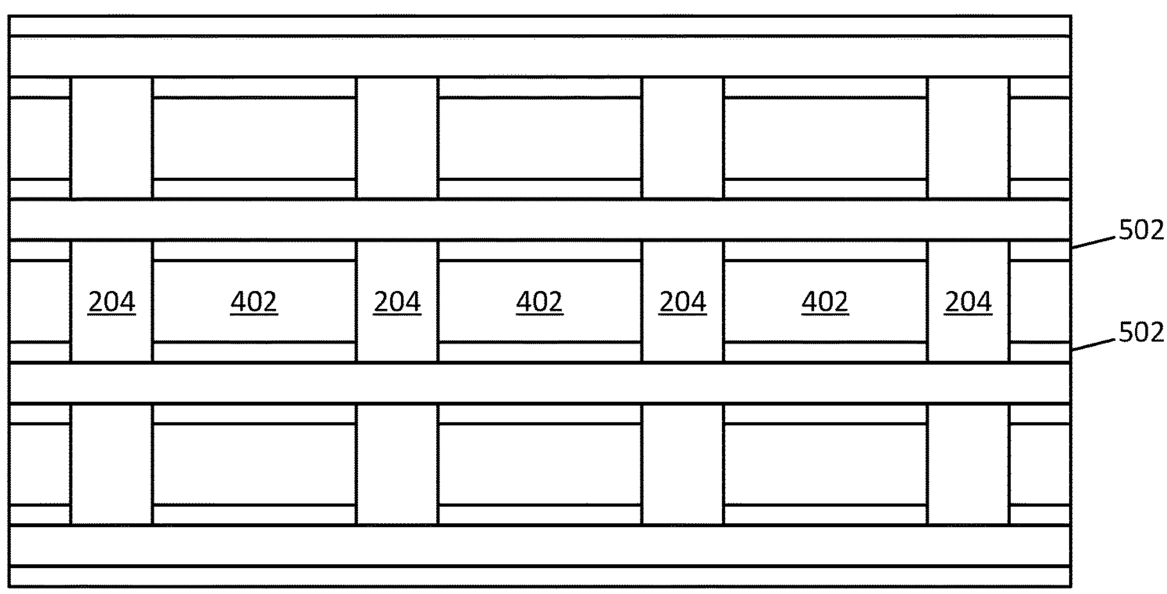

FIGS. 5A and 5B depict the cross-section and plan views of the structure shown in FIGS. 4A and 4B, respectively, following the formation of spacer structures 502, according to some embodiments. Spacer structures 502 may be formed along the sidewalls of sacrificial gates 402 following the removal of gate masking layers 404. In some other embodiments, gate masking layers 404 are retained above sacrificial gates 402 and the spacer structures 502 are formed along sidewalls of both sacrificial gates 402 and gate masking layers 404. Spacer structures 502 may be deposited and then etched back such that spacer structures 502 remain mostly only on sidewalls of any exposed structures. In the plan view of FIG. 5B, spacer structures 502 are shown extending in the second direction along the sidewalls of each sacrificial gate 402. According to some embodiments, spacer structures 502 may be any suitable dielectric material, such as silicon nitride, silicon carbon nitride, or silicon oxycarbonitride. In one such embodiment, spacer structures 502 comprise a nitride and dielectric layer 304 comprises an oxide, so as to provide a degree of etch selectivity during final gate processing. Other etch selective dielectric schemes (e.g., oxide/carbide, carbide/nitride) can be used as well for spacer structures 502 and dielectric layer 304. In other embodiments, spacer structures 502 and dielectric layer 304 are compositionally the same or otherwise similar, where etch selectivity is not employed.

According to some embodiments, exposed portions of the fins between spacer structures 502 along the first direction are removed. The exposed fin portions may be removed using any anisotropic etching process, such as reactive ion etching (RIE). The removal of the exposed fin portions creates source or drain trenches that alternate with gate trenches (currently filled with sacrificial gates 402) along the first direction, according to some embodiments.

Figure 6A:
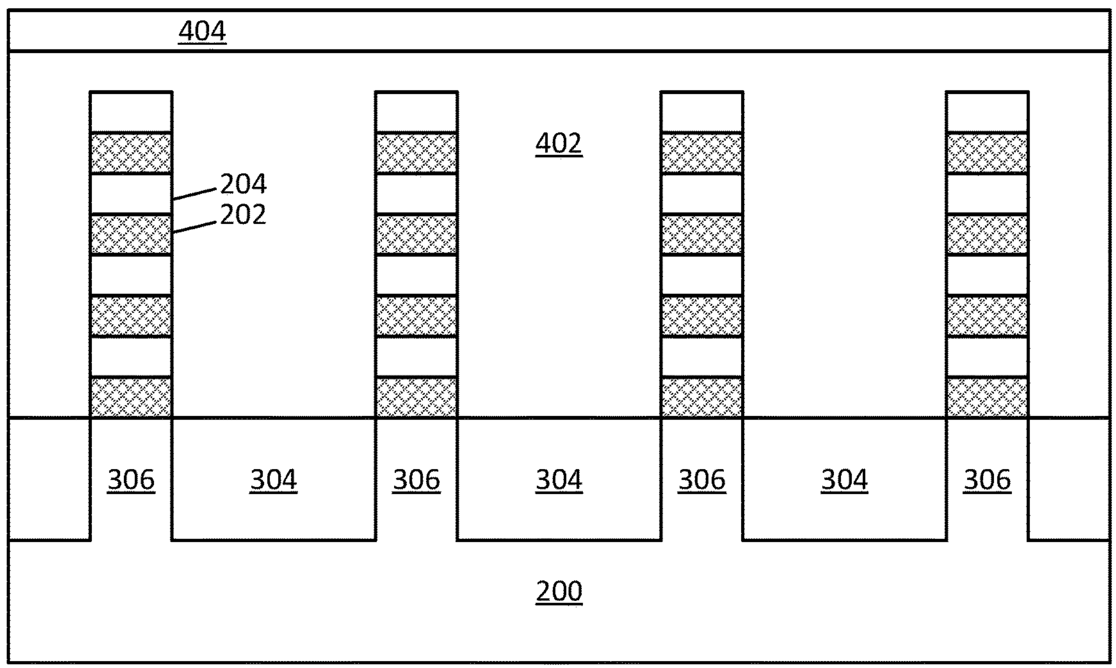
FIGS. 6A and 6B are cross-sectional and plan views, respectively, that illustrate another stage in the example process for forming an integrated circuit configured with a gate link between adjacent gate structures, in accordance with an embodiment of the present disclosure.
Figure 6B:
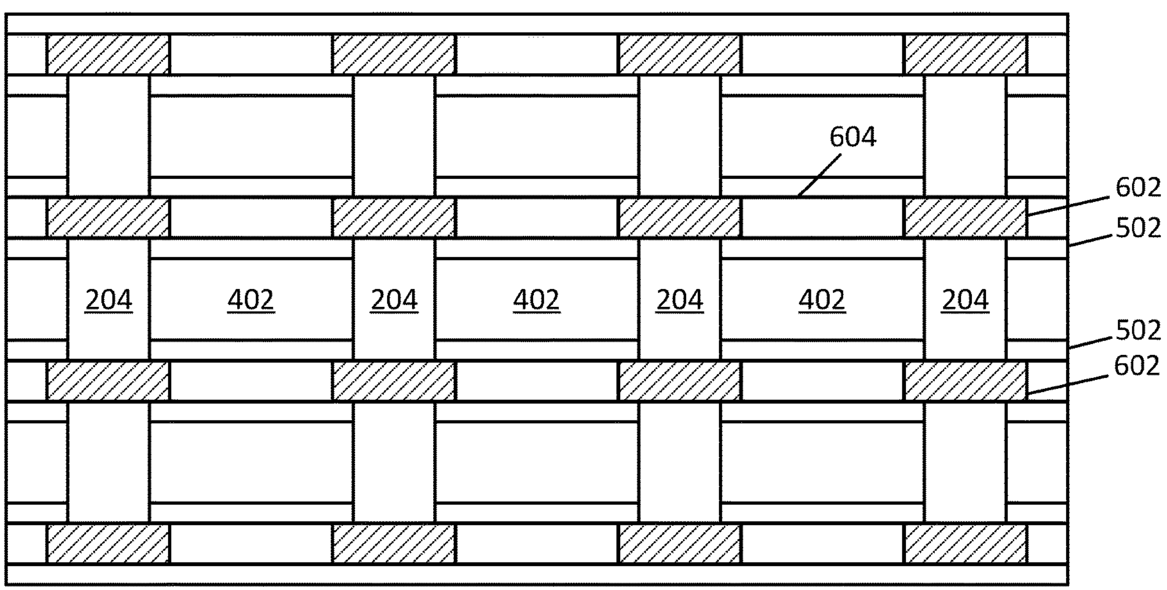

FIGS. 6A and 6B depict the cross-section and plan views of the structure shown in FIGS. 5A and 5B, respectively, following the formation of source or drain regions 602 within the source/drain trenches, according to some embodiments. Source or drain regions 602 may be formed in the areas that had been previously occupied by the exposed fins between spacer structures 502. According to some embodiments, source or drain regions 602 are epitaxially grown from the exposed semiconductor material of the fins (or nanoribbons, nanowires or nanosheets, as the case may be) along the exterior walls of spacer structures 502. In some example embodiments, source or drain regions 602 are NMOS source or drain regions (e.g., epitaxial silicon) or PMOS source or drain regions (e.g., epitaxial SiGe).

According to some embodiments, a dielectric fill 604 is provided between adjacent source or drain regions 602. Dielectric fill 604 may be any suitable dielectric material, such as silicon oxide. In some examples, dielectric fill 604 also extends over a top surface of source or drain regions 602 (e.g., up to and planar with a top surface of spacer structures 502). One or more conductive contacts may be formed at a later time through dielectric fill 604 to provide electrical contact to source or drain regions 602.

Figure 7A:
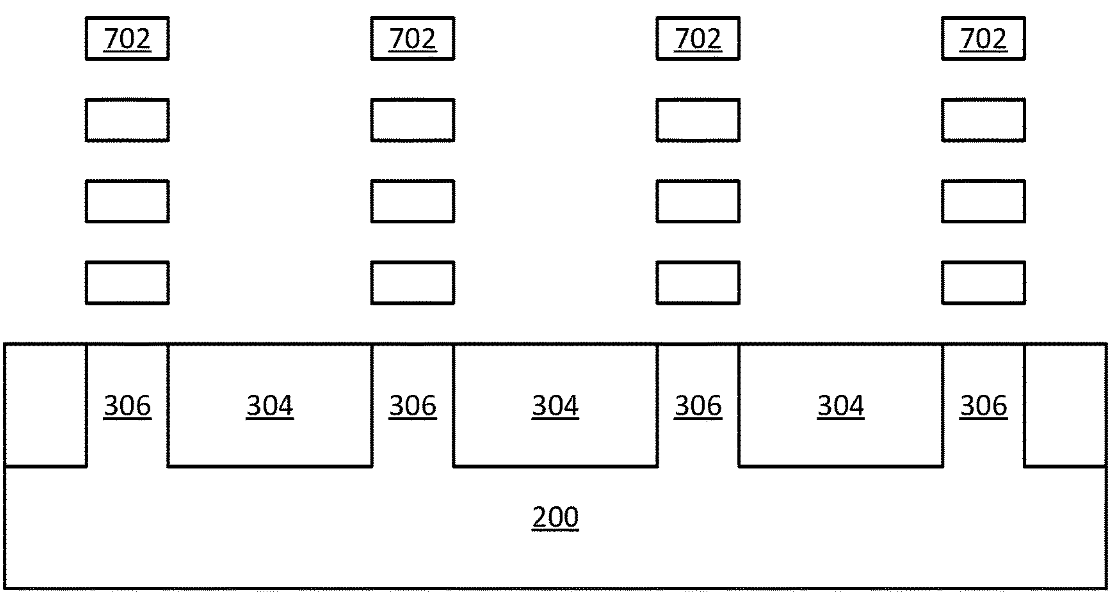
FIGS. 7A and 7B are cross-sectional and plan views, respectively, that illustrate another stage in the example process for forming an integrated circuit configured with a gate link between adjacent gate structures, in accordance with an embodiment of the present disclosure.
Figure 7B:
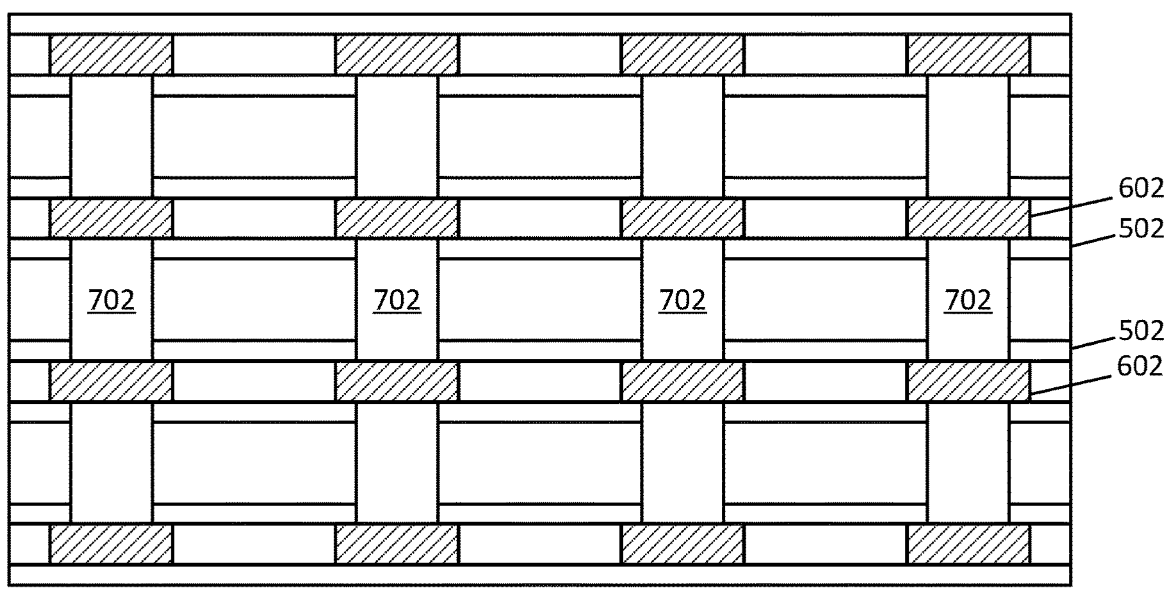

FIGS. 7A and 7B depict the cross-section and plan views of the structure shown in FIGS. 6A and 6B, respectively, following the removal of sacrificial gates 402 and sacrificial layers 202, according to some embodiments. In examples where gate masking layers 404 are still present, they would be removed at this time. Once sacrificial gates 402 are removed, the fins extending between spacer structures 502 are exposed.

In the example where the fins include alternating semiconductor layers, sacrificial layers 202 are selectively removed to leave behind nanoribbons 702 that extend between corresponding source or drain regions 602. Each vertical set of nanoribbons 702 represents the semiconductor region of a different semiconductor device. It should be understood that nanoribbons 702 may also be nanowires or nanosheets. Sacrificial gates 402 and sacrificial layers 202 may be removed using the same isotropic etching process or different isotropic etching processes.

Figure 8A:
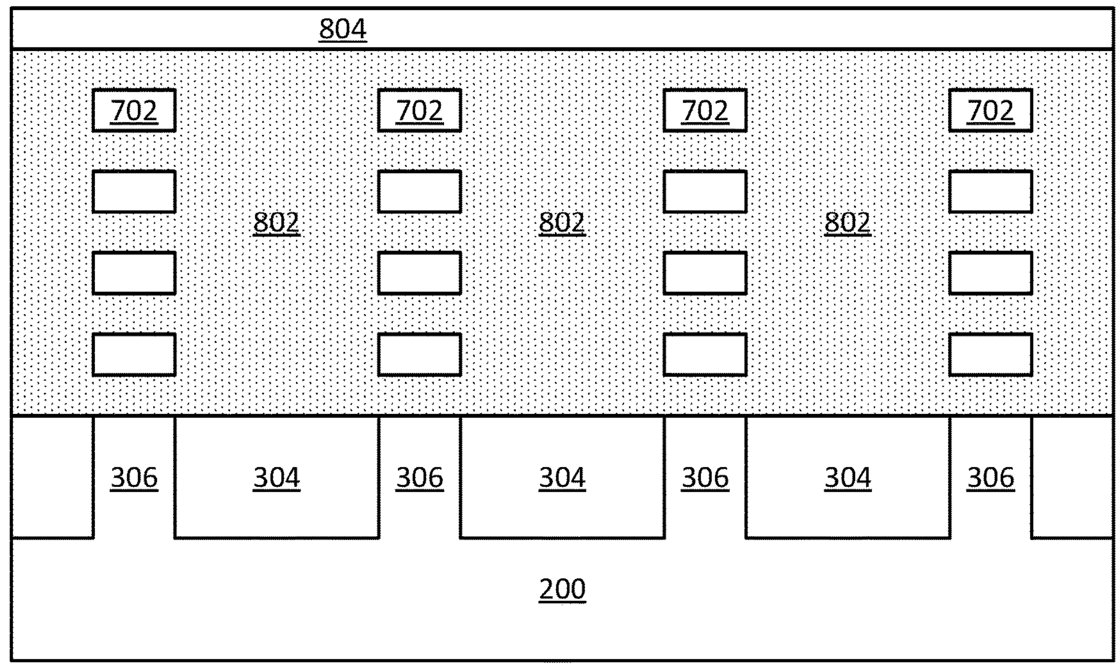
FIGS. 8A and 8B are cross-sectional and plan views, respectively, that illustrate another stage in the example process for forming an integrated circuit configured with a gate link between adjacent gate structures, in accordance with an embodiment of the present disclosure.
Figure 8B:
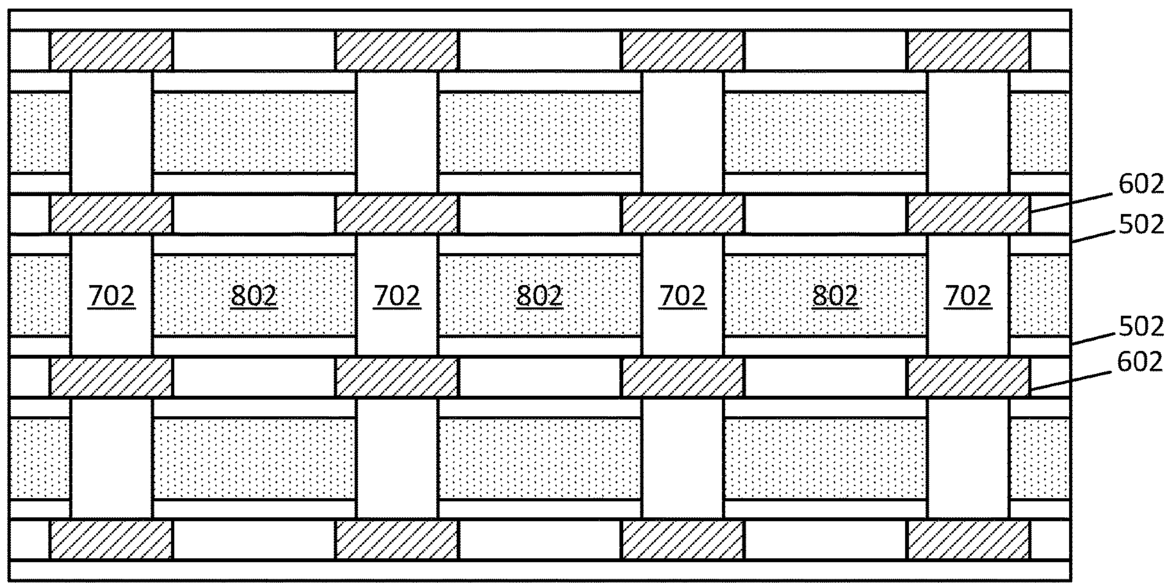

FIGS. 8A and 8B depict the cross-section and plan views of the structure shown in FIGS. 7A and 7B, respectively, following the formation of a gate structure 802 and subsequent gate cap 804, according to some embodiments. Gate structure 802 includes a gate dielectric and a gate electrode on the gate dielectric. The gate dielectric may be first formed around nanoribbons 702 prior to the formation of the conductive gate electrode, which may include one or more conductive layers. The gate dielectric may include any suitable dielectric material (such as silicon dioxide, and/or a high-k dielectric material). Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. According to some embodiments, the gate dielectric includes a layer of hafnium oxide with a thickness between about 1 nm and about 5 nm. In some embodiments, the gate dielectric may include one or more silicates (e.g., titanium silicate, tungsten silicate, niobium silicate, and silicates of other transition metals). In some cases, the gate dielectric includes a first layer on nanoribbons 702, and a second layer on the first layer. The first layer can be, for instance, an oxide of the semiconductor material of nanoribbons 702 (e.g., silicon dioxide) and the second layer can be a high-k dielectric material (e.g., hafnium oxide).

The one or more conductive layers that make up the gate electrode may be deposited using electroplating, electroless plating, CVD, PECVD, ALD, or PVD, to name a few examples. In some embodiments, the gate electrode includes doped polysilicon, a metal, or a metal alloy. Example suitable metals or metal alloys include aluminum, tungsten, cobalt, molybdenum, ruthenium, titanium, tantalum, copper, and carbides and nitrides thereof. The gate electrode may include, for instance, a metal fill material along with one or more workfunction layers, resistance-reducing layers, and/or barrier layers. The workfunction layers can include, for example, p-type workfunction materials (e.g., titanium nitride) for PMOS gates, or n-type workfunction materials (e.g., titanium aluminum carbide) for NMOS gates.

Figure 9A:
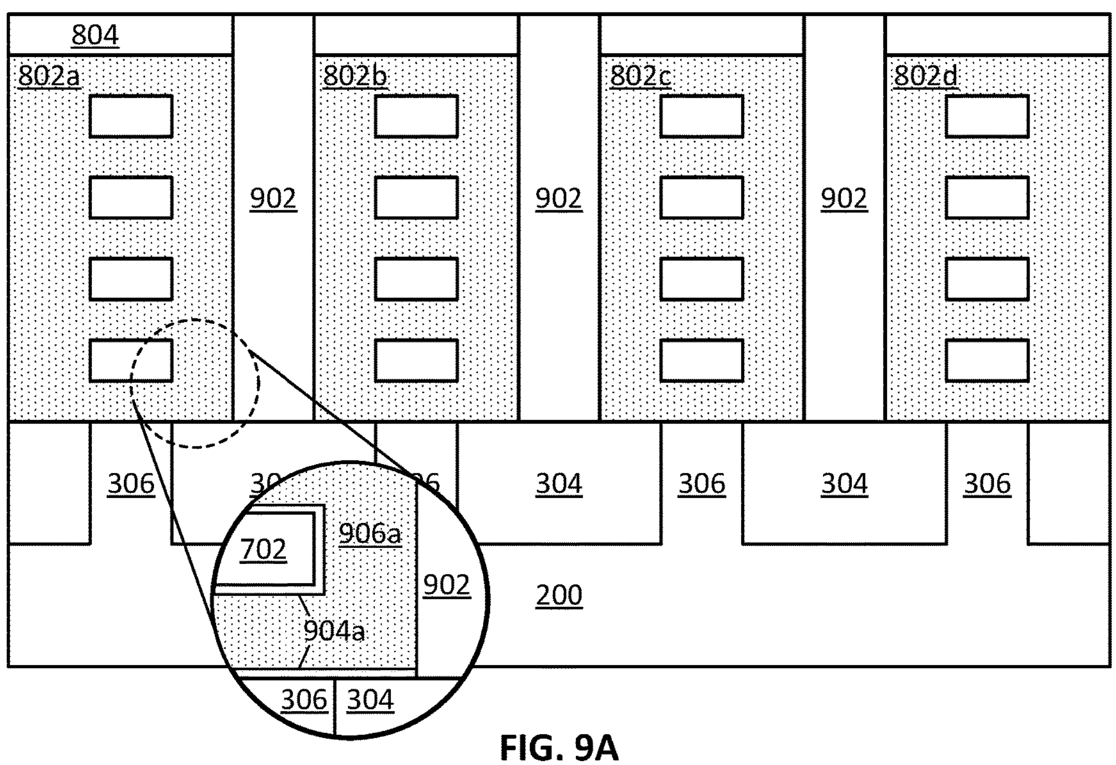
FIGS. 9A and 9B are cross-sectional and plan views, respectively, that illustrate another stage in the example process for forming an integrated circuit configured with a gate link between adjacent gate structures, in accordance with an embodiment of the present disclosure.
Figure 9B:
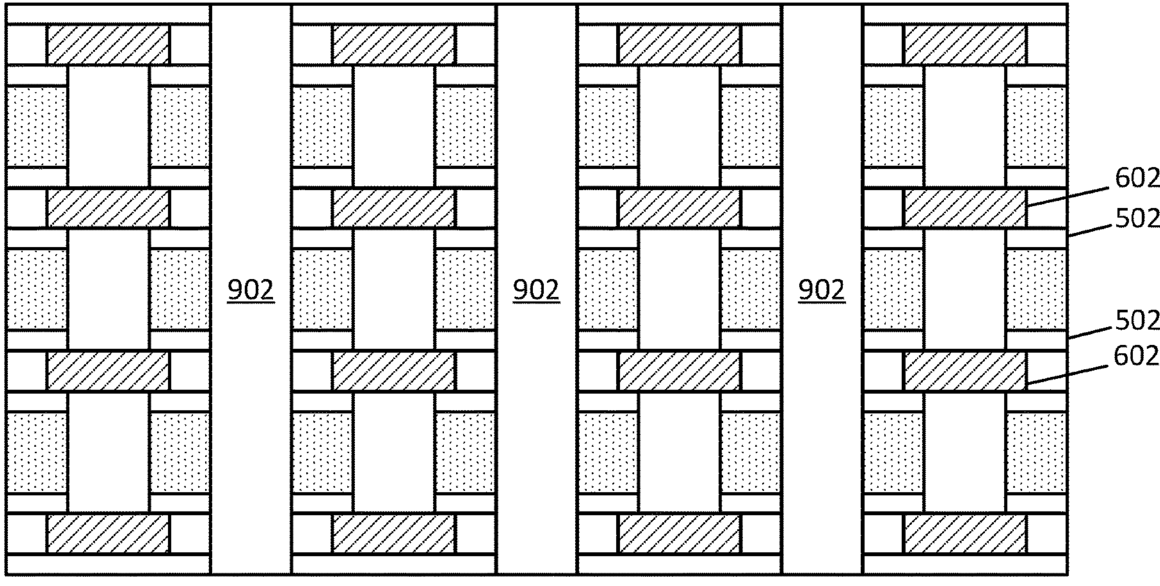

FIGS. 9A and 9B depict the cross-section and plan views of the structure shown in FIGS. 8A and 8B, respectively, following the formation of gate cuts 902 extending in the first direction between devices, according to some embodiments. Gate cuts 902 extend to a depth at least through an entire thickness of gate structure 802 to isolate separate gate structures **802*a*-802*d*. In some embodiments, gate cuts 902 extend into at least a portion of dielectric layer 304 or through an entire thickness of dielectric layer 304. In some embodiments, gate cuts 902 extend entirely through dielectric layer 304 and into a portion of substrate 200**.

According to some embodiments, gate cuts 902 may be formed by first forming corresponding gate cut recesses through gate cap 804 and gate structure 802 using any suitable metal gate etch process that iteratively etches through portions of the gate electrode while simultaneously protecting the sidewalls of the recess from lateral etching to provide a high height-to-width aspect ratio recess (e.g., aspect ratio of 5:1 or higher, or 10:1 or higher). As shown in FIG. 9B, the gate cut recesses extend in the first direction through multiple gate trenches and source/drain trenches to isolate adjacent gate structures and source or drain regions. The gate cut recesses may be filled with one or more dielectric materials to form gate cuts 902. For example, gate cuts 902 may include only silicon oxide or silicon nitride or silicon carbide. In some examples, gate cuts 902 include a first dielectric layer deposited first and a second dielectric layer or dielectric fill formed on the first dielectric layer. The first dielectric layer may include a high-k dielectric material (e.g., materials with a dielectric constant higher than that of silicon oxide or higher than 3.9) while the second dielectric layer may include a low-k dielectric material (e.g. materials with a dielectric constant equal to or lower than that of silicon oxide, such as porous silicon oxide, or equal to or lower than 3.9).

Since gate cuts 902 are formed after the formation of gate structure 802, certain features of gate structure 802 are not present along sidewalls of gate cuts 902. As seen in the expanded view of FIG. 9A, a given gate structure **802*a* includes a gate dielectric 904*a* and a gate electrode 906*a*. Gate dielectric 904*a* is formed around nanoribbons 702 and along a bottom surface of the gate trench (e.g., over subfin 306 and dielectric layer 304). However, according to some embodiments, gate dielectric 904*a* is not along the sidewall of gate cut 902 as it was formed before the formation of gate cut 902. Gate electrode 906*a* may directly contact the sidewall of gate cut 902. It should be understood that the brief intersecting area between gate dielectric 904*a* and the outer edges of gate cut 902 does not mean that gate dielectric 904*a* is on the sidewalls of gate cut 902. Rather, in this context, a material that is on a sidewall must be formed on the sidewall, and gate dielectric 904***a* is not formed on or along the sidewalls of gate cut 902.

According to some embodiments, each gate structure 902*a*-902*d* is formed over the semiconductor region of a single corresponding semiconductor device. Each gate structure 902*a*-902*d* may be constrained over a single semiconductor device in the second direction by adjacent gate cuts 902. Following the formation of gate structures 902*a*-902*d*, the entire structure may be polished such that the top surface of gate structures 902*a*-902*d* are planar with the top surface of at least spacer structures 502. According to some embodiments, a gate cut 902 is present between each adjacent pair of semiconductor devices in the second direction.

Figure 10A:
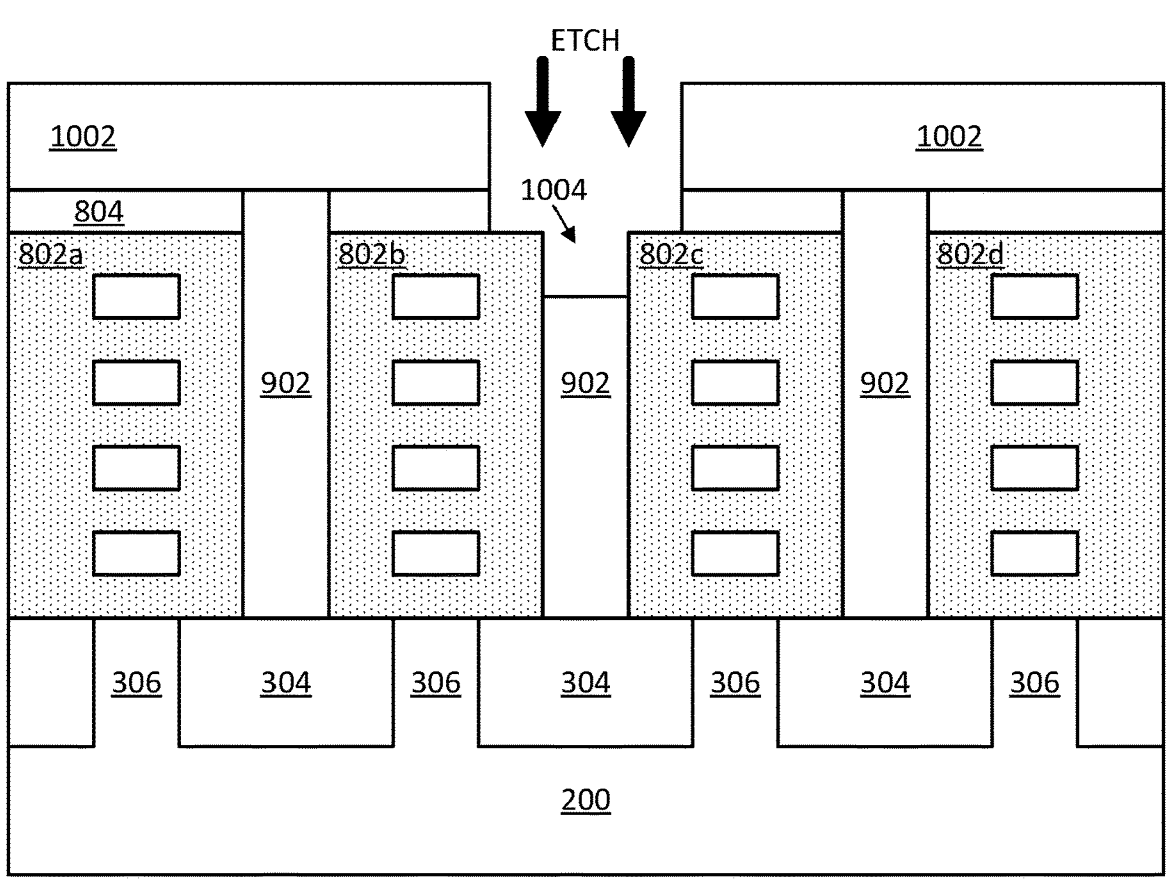
FIGS. 10A and 10B are cross-sectional and plan views, respectively, that illustrate another stage in the example process for forming an integrated circuit configured with a gate link between adjacent gate structures, in accordance with an embodiment of the present disclosure.
Figure 10B:
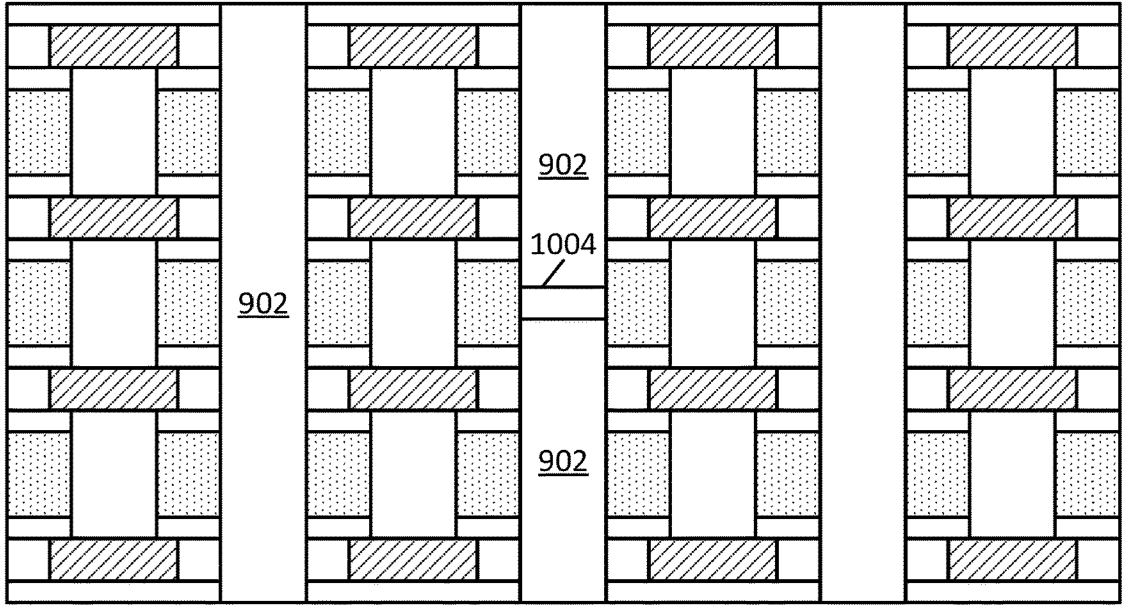

FIGS. 10A and 10B depict the cross-section and plan views of the structure shown in FIGS. 9A and 9B, respectively, following the formation of a masking layer 1002 having an opening aligned over a portion of a given gate cut 902 and the subsequent removal of gate cap 804 and a portion of the gate cut 902 within the opening, according to an embodiment. Masking layer 1002 may be any suitable hard mask or photoresist. A reactive ion etching (RIE) process may be used to punch through cap layer 804 and continue to form a recess 1004 through the exposed gate cut 902. According to some embodiments, the etching process does not recess (or recesses very little) of the exposed gate structures 802*b* and 802*c*.

Both FIG. 10A and FIG. 10B illustrate how recess 1004 extends across an entirety of gate cut 902 along the second direction to expose sidewalls of the gate electrodes of both gate structures 802*b* and 802*c*. FIG. 10B further illustrates that recess 1004 may have a smaller width compared to a width of either gate structures 802*b* or 802*c*, with such widths being measured in the first direction. Recess 1004 does not need to be centrally aligned along the first direction between gate structures 802*b* and 802*c*. In some embodiments, recess 1004 may be shifted along the first direction so long as at least some portion of the gate electrodes of gate structures 802*b* and 802*c* are exposed within recess 1004.

Figure 11A:
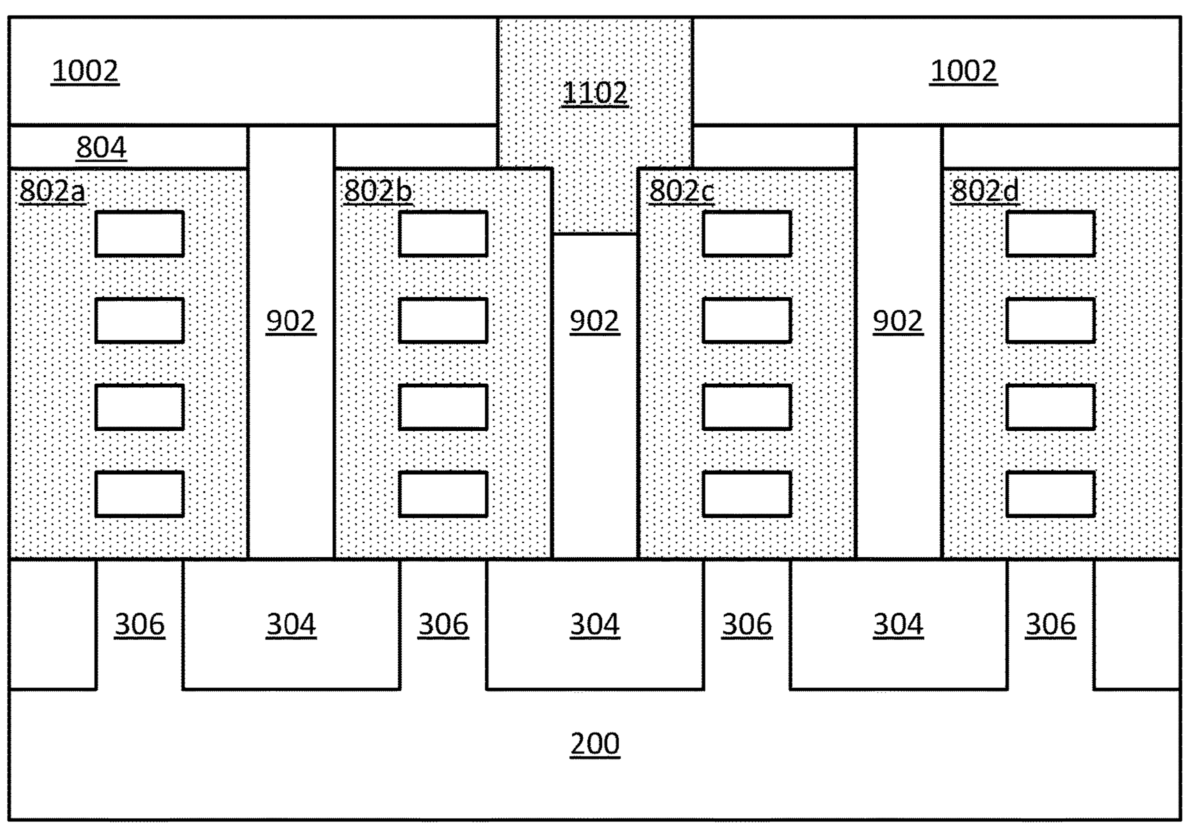
FIGS. 11A and 11B are cross-sectional and plan views, respectively, that illustrate another stage in the example process for forming an integrated circuit configured with a gate link between adjacent gate structures, in accordance with an embodiment of the present disclosure.
Figure 11B:
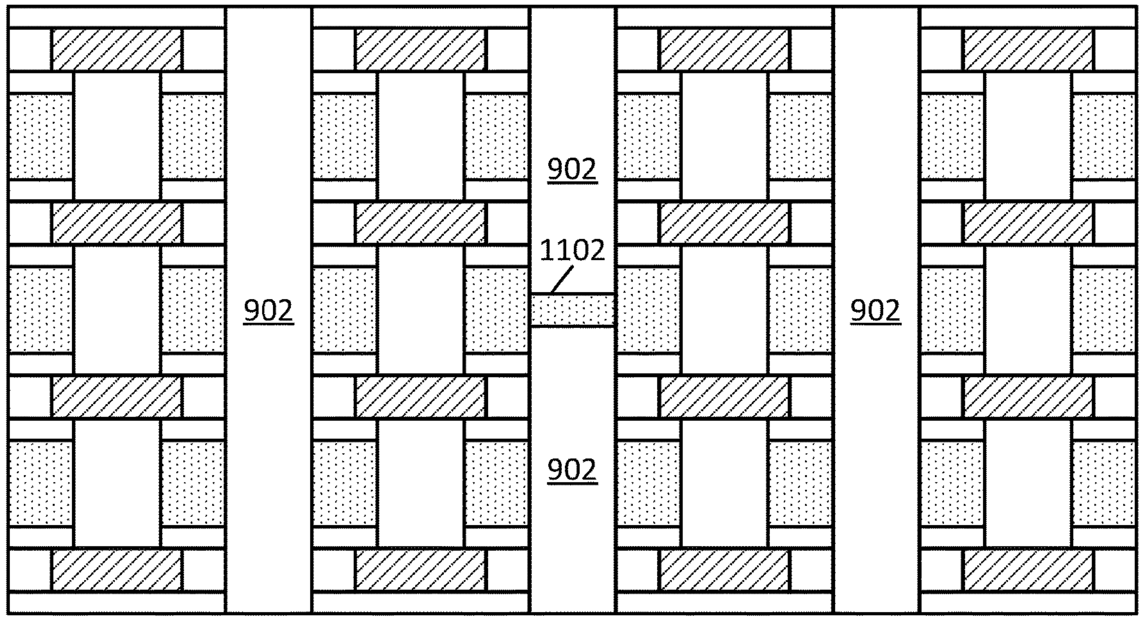

FIGS. 11A and 11B depict the cross-section and plan views of the structure shown in FIGS. 10A and 10B, respectively, following the formation of a conductive fill 1102 within recess 1004 and between gate cap 804, according to some embodiments. Conductive fill 1102 may be any suitable conductive material, and may include any of the conductive materials noted above for the gate electrode. In some embodiments, conductive fill 1102 includes the same conductive material as the gate electrode for either or both of gate structures 802*b* or 802*c*. In some examples, conductive fill 1102 includes molybdenum. In some cases, conductive fill 1102 may include multiple layers, such as a first liner or barrier layer (e.g., titanium or tantalum nitride) and a second fill material (e.g., molybdenum or tungsten) on the first material.

Figure 12A:
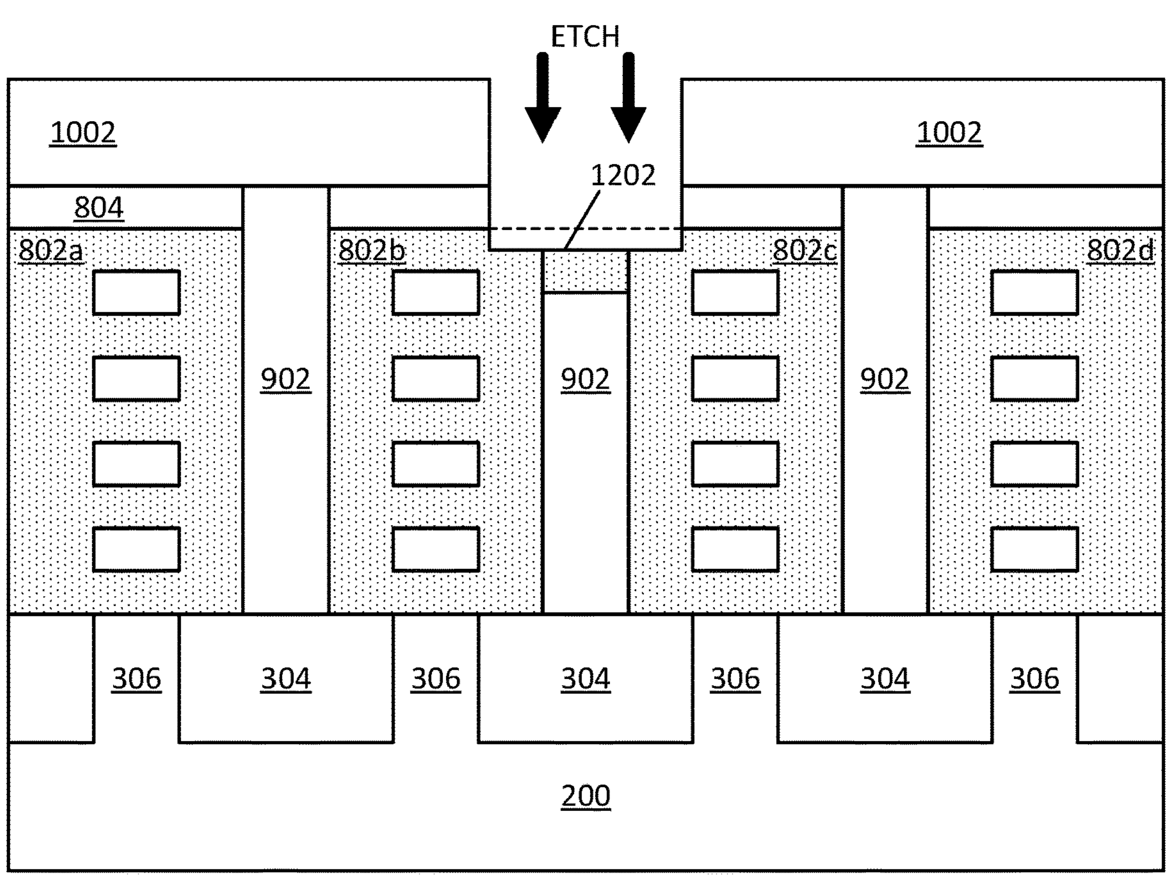
FIGS. 12A and 12B are cross-sectional and plan views, respectively, that illustrate another stage in the example process for forming an integrated circuit configured with a gate link between adjacent gate structures, in accordance with an embodiment of the present disclosure.
Figure 12B:
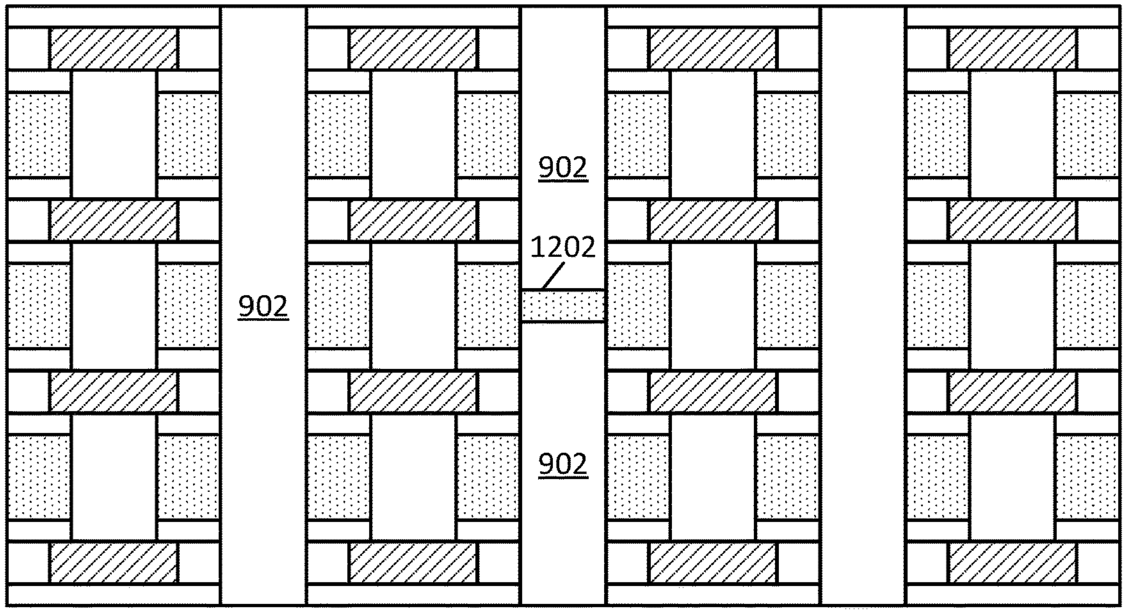

FIGS. 12A and 12B depict the cross-section and plan views of the structure shown in FIGS. 11A and 11B, respectively, following an etching operation to recess conductive fill 1102 resulting in a conductive bridge 1202 between gate structures 802*a* and 802*b*, according to some embodiments. The conductive material may be recessed using any suitable metal etching process. The etch may exhibit a high selectivity between metal and dielectric materials such that any etching to cap layer 804 or masking layer 1002 is minimized. According to some embodiments, the etch may recess the conductive material lower than a top surface of gate structures 802*b* and 802*c* (identified by the dotted line in FIG. 12A). In other embodiments, the etch may recess the conductive material to a final thickness that is flush with, or above, the top surface of gate structures 802*b* and 802*c*. As shown, conductive bridge 1202 extends along a top surface of gate cut 902 and is in contact with a sidewall of both gate structures 802*a* and 802*b*, thus providing a conductive bridge between gate structures 802*a* and 802*b*.

Figure 13A:
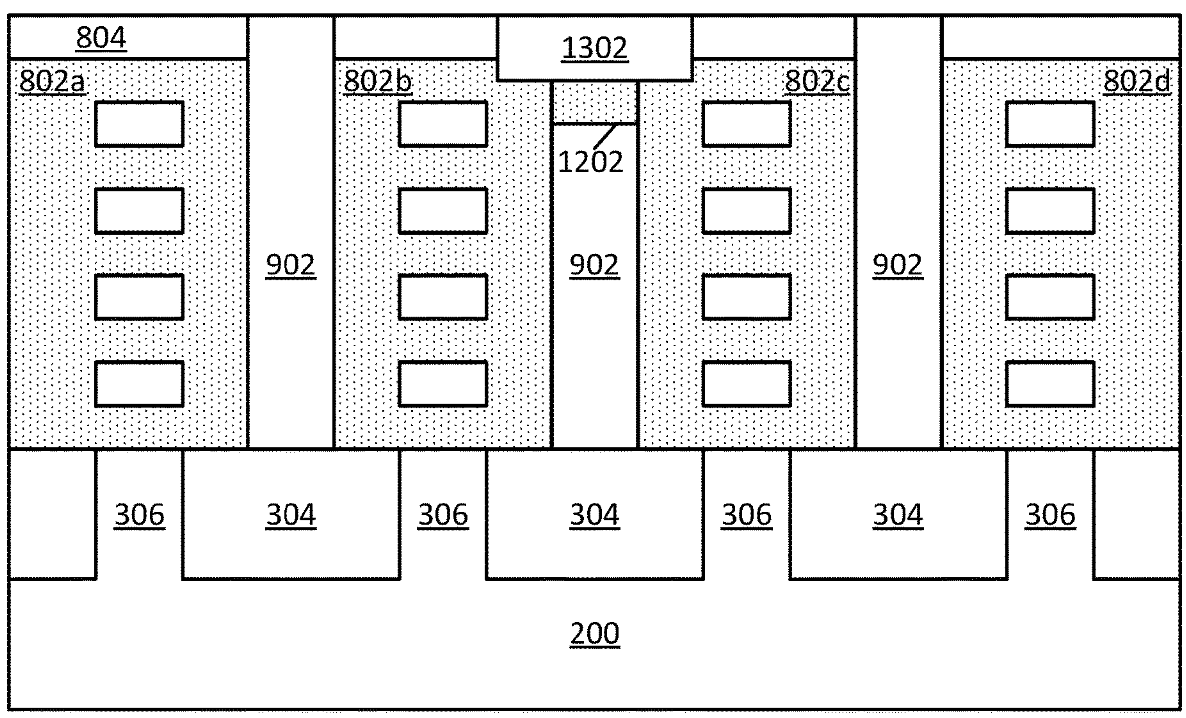
FIGS. 13A and 13B are cross-sectional and plan views, respectively, that illustrate another stage in the example process for forming an integrated circuit configured with a gate link between adjacent gate structures, in accordance with an embodiment of the present disclosure.
Figure 13B:
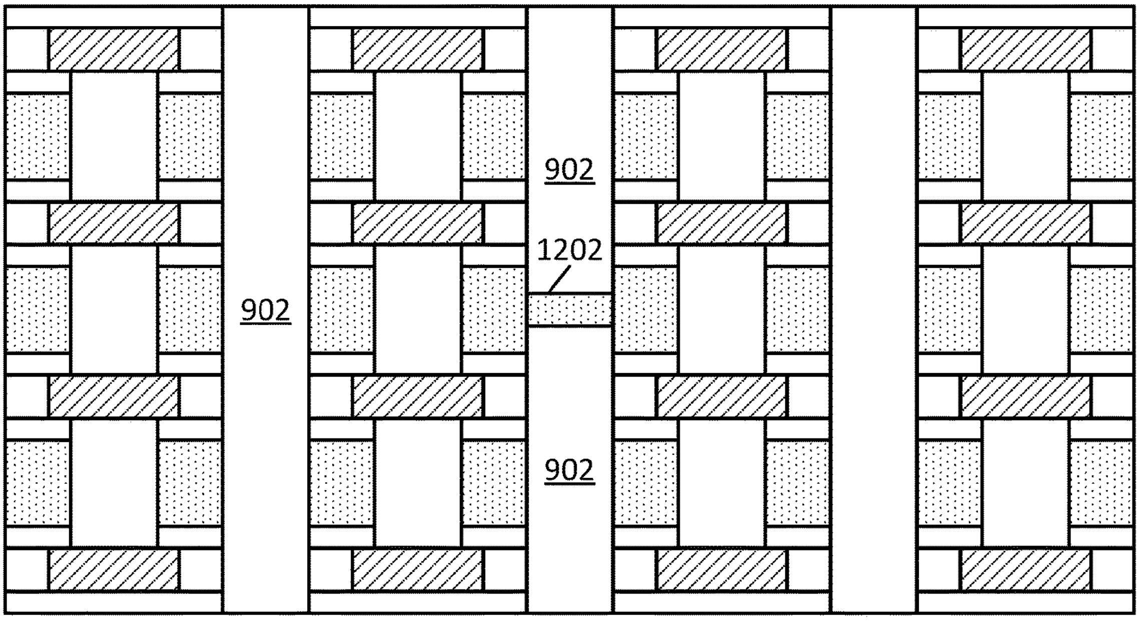

FIGS. 13A and 13B depict the cross-section and plan views of the structure shown in FIGS. 12A and 12B, respectively, following the formation of a dielectric plug 1302 within the recess formed by the conductive etching process, according to some embodiments. Following the deposition of the dielectric material to form dielectric plug 1302, a polishing process may be performed using chemical mechanical polishing (CMP) to planarize the top of the structure such that a top surface of dielectric plug 1302 is substantially coplanar with a top surface of gate cap 804. Dielectric plug 1302 may be any suitable material, however in some embodiments, dielectric plug 1302 is the same dielectric material as gate cap 804. Accordingly, gate cap 804 and dielectric plug 1302 may be considered a homogenous dielectric layer. Because they are deposited at different times, there may be a seam demarcating the separate deposition. Such a seam may be visible, for instance, via SEM.

According to some embodiments, dielectric plug 1302 has a thickness over gate cut 902 and in a third direction (vertical, or bottom-to-top in FIG. 13A) that is greater than a thickness of gate cap 804 (e.g., not over gate cut 902) in the third direction, due to the recess extending below the top surface of gate structures 802*b* and 802*c*. The thickness difference may be at least 1 nm, at least 2 nm, or at least 3 nm, or at least 5 nm, or at least 7 nm. In some such example embodiments, the thickness difference is between 1 nm and 5 nm.

Figure 13C:
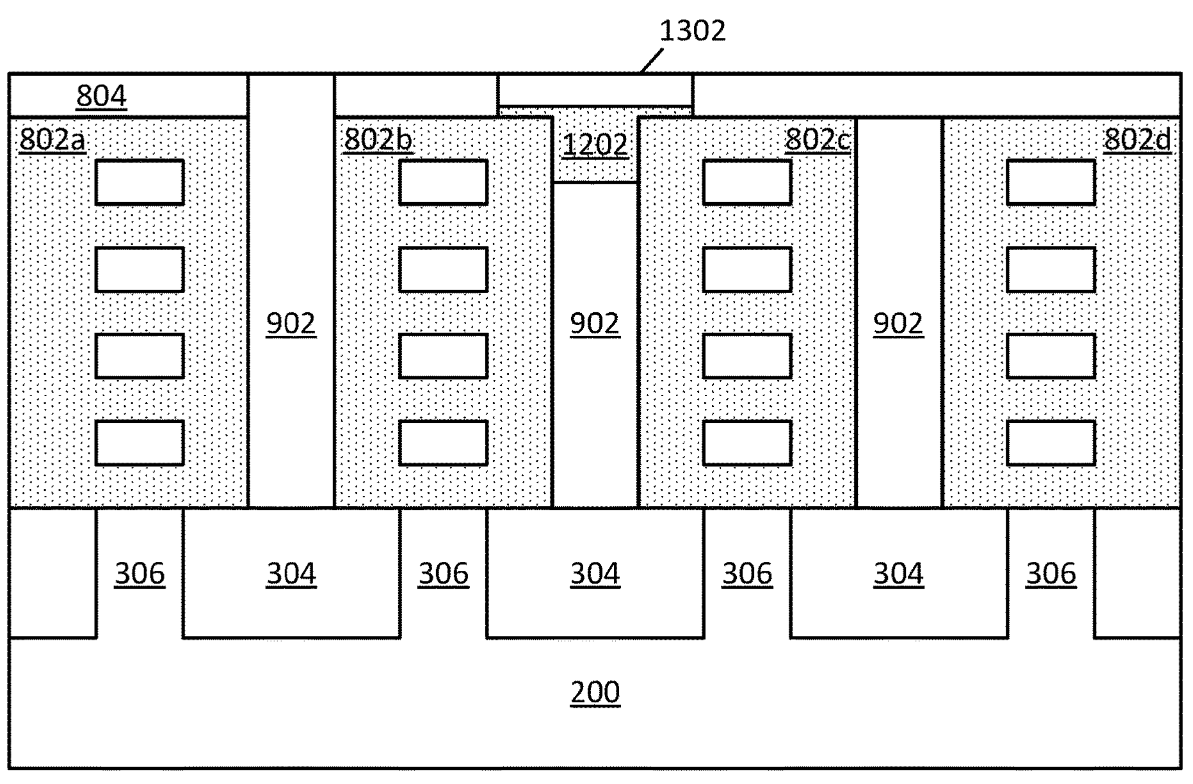
FIG. 13C is a cross-sectional view of an example gate link that has a different structure from the gate link of FIG. 13A, in accordance with another embodiment of the present disclosure.

FIG. 13C illustrates an alternative cross-section view of the structure that is similar to that shown in FIG. 13A, but with dielectric plug 1302 having a smaller thickness over gate cut 902 and in the third direction compared to gate cap 804, according to an embodiment. This situation may occur if the recessing process used to etch through conductive fill 1102 does not reach the top surface of gate structures 802*b* and 802*c*, such that a top surface of conductive bridge 1202 is above the top surface of gate structures 802*b* and 802*c*, as shown. The thickness difference between dielectric plug 1302 and gate cap 804, as illustrated in FIG. 13C, may be at least 1 nm, at least 2 nm, or at least 3 nm, or at least 5 nm, or at least 7 nm. In some such example embodiments, the thickness difference is between 1 nm and 5 nm.

Figure 14:
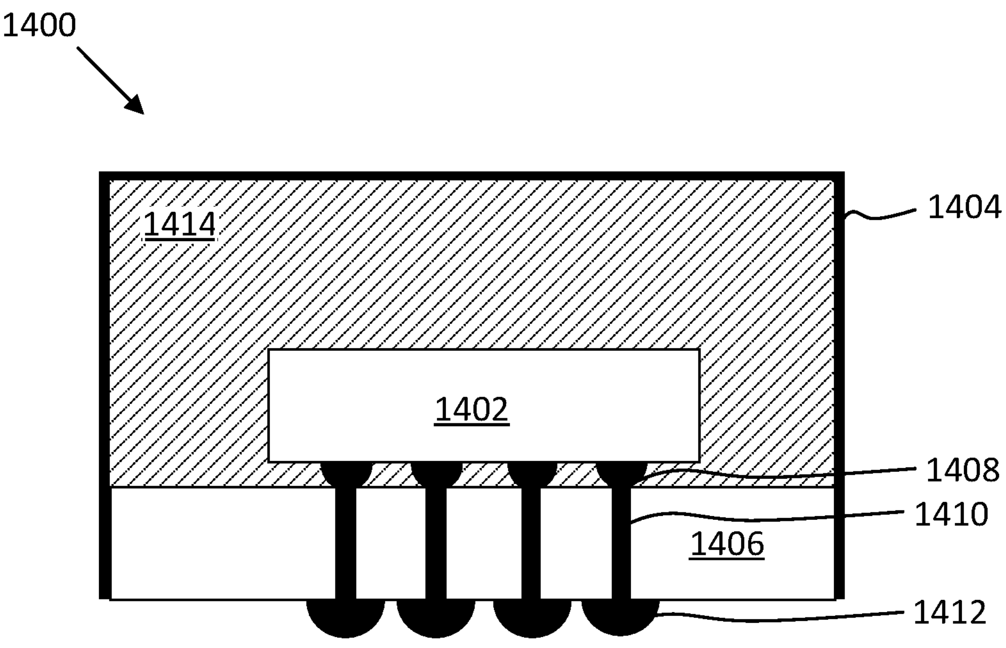
FIG. 14 illustrates a cross-section view of a chip package containing one or more semiconductor dies, in accordance with some embodiments of the present disclosure.

FIG. 14 illustrates an example embodiment of a chip package 1400, in accordance with an embodiment of the present disclosure. As can be seen, chip package 1400 includes one or more dies 1402. One or more dies 1402 may include at least one integrated circuit having semiconductor devices, such as any of the semiconductor devices disclosed herein. One or more dies 1402 may include any other circuitry used to interface with other devices formed on the dies, or other devices connected to chip package 1400, in some example configurations.

As can be further seen, chip package 1400 includes a housing 1404 that is bonded to a package substrate 1406. The housing 1404 may be any standard or proprietary housing, and may provide, for example, electromagnetic shielding and environmental protection for the components of chip package 1400. The one or more dies 1402 may be conductively coupled to a package substrate 1406 using connections 1408, which may be implemented with any number of standard or proprietary connection mechanisms, such as solder bumps, ball grid array (BGA), pins, or wire bonds, to name a few examples. Package substrate 1406 may be any standard or proprietary package substrate, but in some cases includes a dielectric material having conductive pathways (e.g., including conductive vias and lines) extending through the dielectric material between the faces of package substrate 1406, or between different locations on each face. In some embodiments, package substrate 1406 may have a thickness less than 1 millimeter (e.g., between 0.1 millimeters and 0.5 millimeters), although any number of package geometries can be used. Additional conductive contacts 1412 may be disposed at an opposite face of package substrate 1406 for conductively contacting, for instance, a printed circuit board (PCB). One or more vias 1410 extend through a thickness of package substrate 1406 to provide conductive pathways between one or more of connections 1408 to one or more of contacts 1412. Vias 1410 are illustrated as single straight columns through package substrate 1406 for ease of illustration, although other configurations can be used (e.g., damascene, dual damascene, through-silicon via, or an interconnect structure that meanders through the thickness of substrate 1406 to contact one or more intermediate locations therein). In still other embodiments, vias 1410 are fabricated by multiple smaller stacked vias, or are staggered at different locations across package substrate 1406. In the illustrated embodiment, contacts 1412 are solder balls (e.g., for bump-based connections or a ball grid array arrangement), but any suitable package bonding mechanism may be used (e.g., pins in a pin grid array arrangement or lands in a land grid array arrangement). In some embodiments, a solder resist is disposed between contacts 1412, to inhibit shorting.

In some embodiments, a mold material 1414 may be disposed around the one or more dies 1402 included within housing 1404 (e.g., between dies 1402 and package substrate 1406 as an underfill material, as well as between dies 1402 and housing 1404 as an overfill material). Although the dimensions and qualities of the mold material 1414 can vary from one embodiment to the next, in some embodiments, a thickness of mold material 1414 is less than 1 millimeter. Example materials that may be used for mold material 1414 include epoxy mold materials, as suitable. In some cases, the mold material 1414 is thermally conductive, in addition to being electrically insulating.

Methodology

Figure 15:
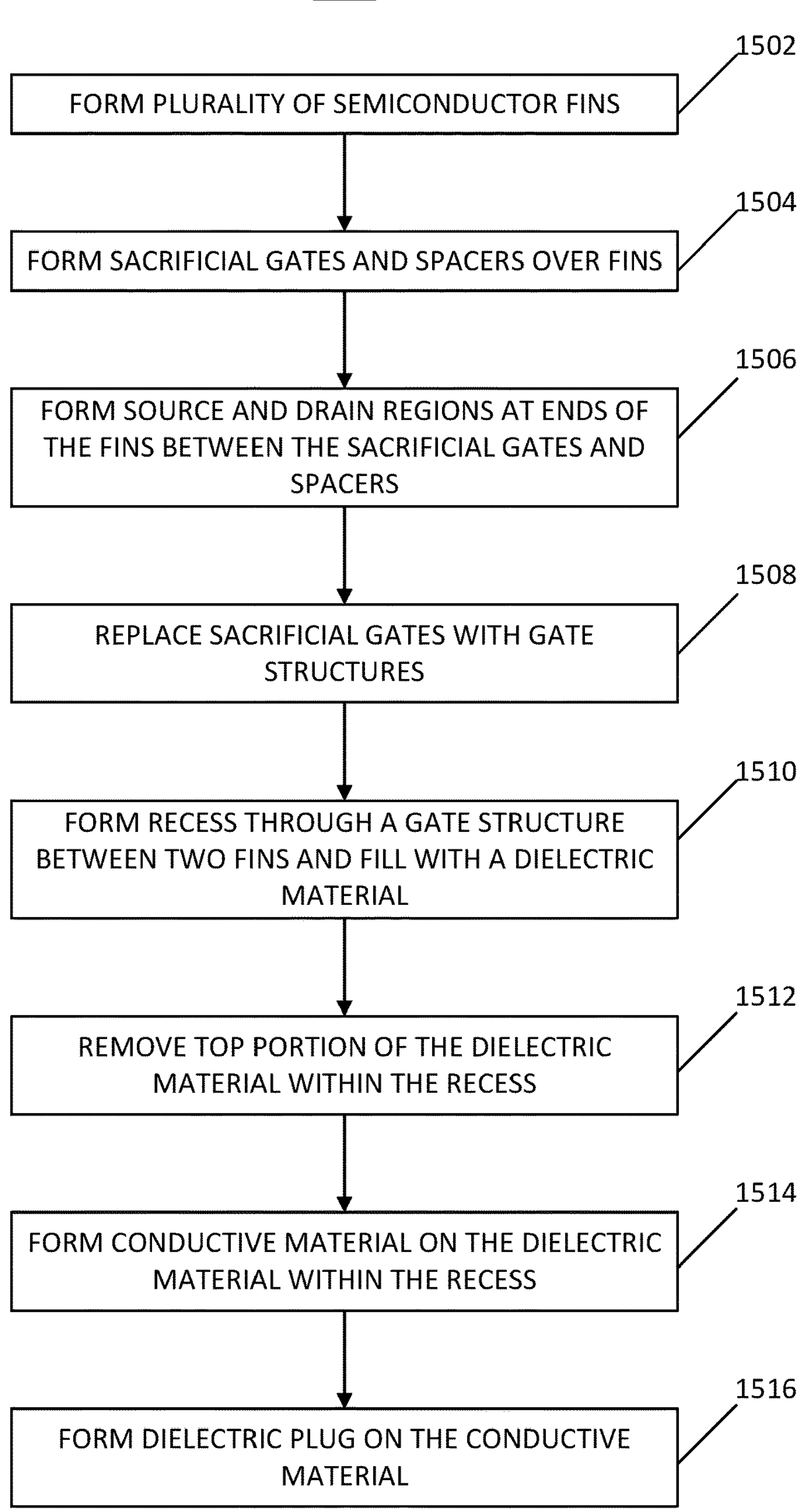
FIG. 15 is a flowchart of a fabrication process for a semiconductor device having a gate link between adjacent gate structures, in accordance with an embodiment of the present disclosure.

FIG. 15 is a flow chart of a method 1500 for forming at least a portion of an integrated circuit, according to an embodiment. Various operations of method 1500 may be illustrated in FIGS. 2A-13A and 2B-13B. However, the correlation of the various operations of method 1500 to the specific components illustrated in the aforementioned figures is not intended to imply any structural and/or use limitations. Rather, the aforementioned figures provide one example embodiment of method 1500. Other operations may be performed before, during, or after any of the operations of method 1500. For example, method 1500 does not explicitly describe various processes that are performed to form common transistor structures. Some of the operations of method 1500 may be performed in a different order than the illustrated order.

Method 1500 begins with operation 1502 where a plurality of parallel semiconductor fins are formed, according to some embodiments. The semiconductor material in the fins may be formed from a substrate such that the fins are an integral part of the substrate (e.g., etched from a bulk silicon substrate). Alternatively, the fins can be formed of material deposited onto an underlying substrate. In one such example case, a blanket layer of silicon germanium (SiGe) can be deposited onto a silicon substrate, and then patterned and etched to form a plurality of SiGe fins extending from that substrate. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out. Again, the alternating layers can be blanket deposited and then etched into fins, or deposited into fin-shaped trenches. The fins may also include a cap structure over each fin that is used to define the locations of the fins during, for example, an RIE process. The cap structure may be a dielectric material, such as silicon nitride.

Method 1500 continues with operation 1504 where sacrificial gates are formed over the fins. The sacrificial gates may be patterned using gate masking layers in strips that run orthogonally over the fins and parallel to one another (e.g., forming a cross-hatch pattern). The gate masking layers may be any suitable hard mask material, such as CHM or silicon nitride. The sacrificial gates themselves may be formed from any suitable material that can be selectively removed at a later time without damaging the semiconductor material of the fins. In one example, the sacrificial gates include polysilicon. Spacer structures may be formed along the sidewalls of the sacrificial gates using an etch-back process. The spacer structures may include any suitable dielectric material, such as silicon nitride. In some cases, spacer structures may also be formed along sidewalls of the exposed fins running orthogonally between the strips of sacrificial gates.

Method 1500 continues with operation 1506 where source or drain regions are formed at the ends of the semiconductor regions of each of the fins. Any portions of the fins not protected by the sacrificial gate and spacer structures may be removed using, for example, an anisotropic etching process followed by the epitaxial growth of the source or drain regions from the exposed ends of the semiconductor layers in the fins. In some example embodiments, the source or drain regions are NMOS source or drain regions (e.g., epitaxial silicon) or PMOS source or drain regions (e.g., epitaxial SiGe). Another dielectric fill may be formed adjacent to the various source or drain regions for additional electrical isolation between adjacent regions. The dielectric fill may also extend over a top surface of the source or drain regions. In some embodiments, topside conductive contacts may be formed through the dielectric fill to contact one or more of the source or drain regions. According to some embodiments, internal gate spacers may be formed during the source drain processing (e.g., after removing the exposed fins but prior to epi growth of source/drain regions, using a lateral etch process that selectively recesses sacrificial material of the channel region and then filling that recess with internal gate spacer material).

Method 1500 continues with operation 1508 where the sacrificial gates are removed and replaced with gate structures. The sacrificial gates may be removed using an isotropic etching process that selectively removes all of the material from the sacrificial gates, thus exposing the various fins between the set of spacer structures. In the example case where GAA transistors are used, any sacrificial layers within the exposed fins between the spacer structures may also be removed to release nanoribbons, nanosheets, or nanowires of semiconductor material.

The gate structures may each include both a gate dielectric and a gate electrode. The gate dielectric is first formed over the exposed semiconductor regions between the spacer structures followed by forming the gate electrode within the remainder of the trench between the spacer structures, according to some embodiments. The gate dielectric may include any number of dielectric layers deposited using a CVD process, such as ALD. The gate electrode can include any number of conductive material layers, such as any metals, metal alloys, or polysilicon. The gate electrode may be deposited using electroplating, electroless plating, CVD, ALD, PECVD, or PVD, to name a few examples.

Method 1500 continues with operation 1510 where deep recesses are formed through at least a full thickness of the gate structure between adjacent devices and filled with one or more dielectric materials to form gate cuts. Thus, according to some embodiments, gate cuts are formed between all adjacent devices of a given integrated circuit. The deep recesses may be formed using a metal gate etch process that iteratively etches through portions of the gate electrode while simultaneously protecting the sidewalls of the recess from lateral etching to provide a high height-to-width aspect ratio final recess (e.g., aspect ratio of 5:1 or higher, or 10:1 or higher). The recesses may be filled with any number of dielectric materials to form gate cuts that isolate semiconductor devices from one another. Because the gate cuts are formed after the formation of the gate structures, the gate dielectric layers of the gate structures are not on the sidewalls of the gate cuts.

Method 1500 continues with operation 1512, where a top portion of a given gate cut is removed to form a recess over the gate cut. A dielectric etching process may be used to remove the dielectric material of the gate cut while minimizing any removal of the surrounding gate electrode material. The recess may extend across an entirety of the gate cut to expose sidewalls of the gate electrodes of both adjacent gate structures. According to some embodiments, the recess has a smaller width compared to a width of either gate of the adjacent gate structures, which allows for some misalignment tolerance within the gate trench. The recess does not need to be centrally aligned between the adjacent gate structures.

Method 1500 continues with operation 1514, where a conductive material is formed within the recess to form a conductive bridge between the adjacent gate structures. The conductive material may be any suitable conductive material, and may include any of the conductive materials noted above for the gate electrode, such as tungsten or molybdenum. In some embodiments, the conductive fill includes the same conductive material as the gate electrode for either or both of the adjacent gate structures. In some cases, the conductive material may be recessed within the recess. As described above, the height of the conductive material may be lower than the upper surface of the adjacent gate electrodes being bridged, but in other cases may be flush with, or higher than the upper gate electrode surfaces.

Method 1500 continues with operation 1516, where a dielectric plug is formed over the conductive material. A polishing process may be performed using CMP to planarize the top of the structure such that a top surface of the dielectric plug is substantially coplanar with a top surface of adjacent gate cuts. The dielectric plug may be any suitable material, however in some embodiments, the dielectric plug is the same dielectric material as a gate cap formed over the gate structures. According to some embodiments, the dielectric plug has a thickness over the gate cut that is either greater or less than a thickness of the gate cap (e.g., not over the gate cut) due to the recess either being etched to a final position above or below the top surface of the adjacent gate structures. The thickness difference may be at least 1 nm, at least 2 nm, or at least 3 nm. In some embodiments, the thickness difference is between 1 nm and 5 nm.

Example System

Figure 16:
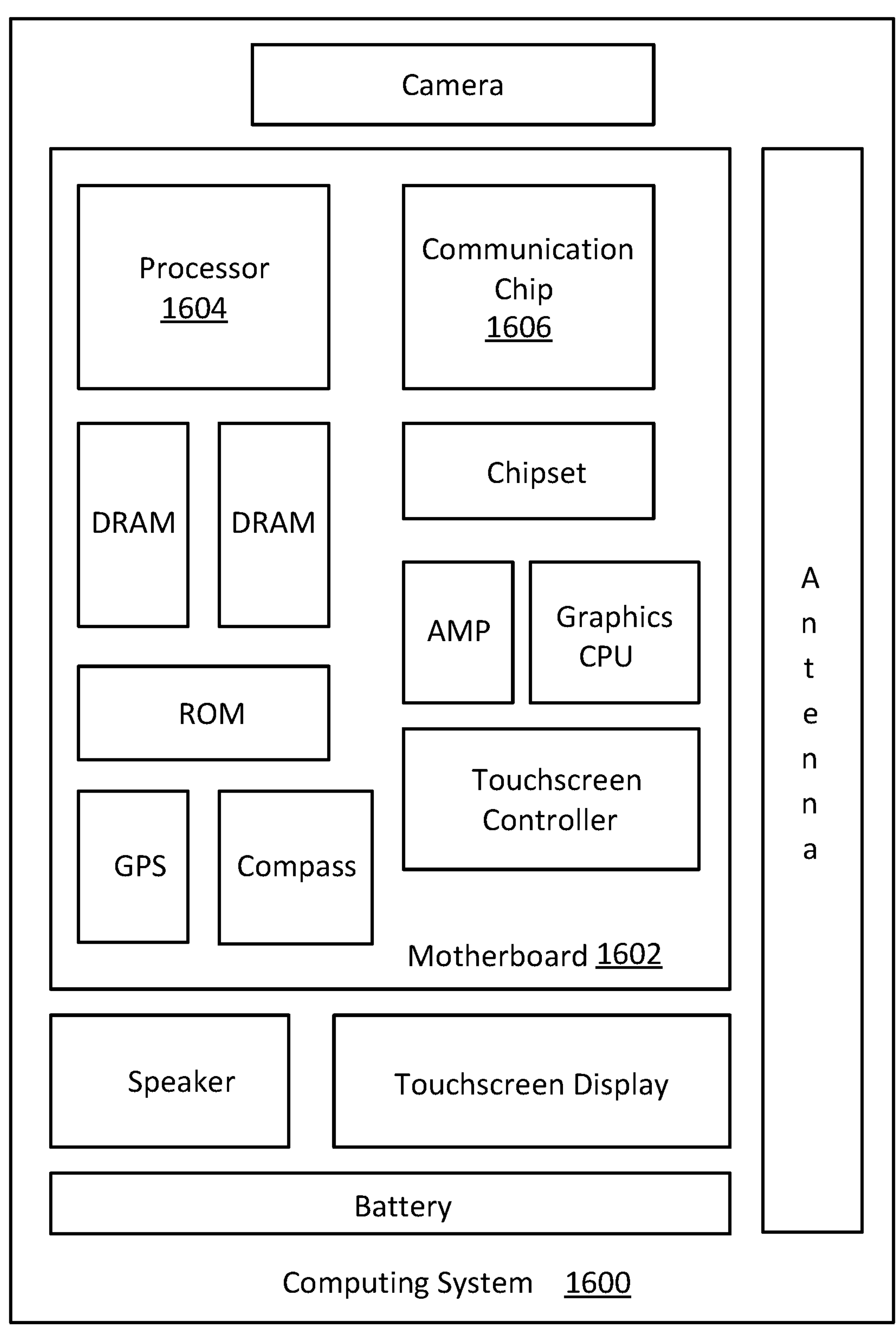
FIG. 16 illustrates a computing system including one or more integrated circuits, as variously described herein, in accordance with an embodiment of the present disclosure.

FIG. 16 is an example computing system implemented with one or more of the integrated circuit structures as disclosed herein, in accordance with some embodiments of the present disclosure. As can be seen, the computing system 1600 houses a motherboard 1602. The motherboard 1602 may include a number of components, including, but not limited to, a processor 1604 and at least one communication chip 1606, each of which can be physically and electrically coupled to the motherboard 1602, or otherwise integrated therein. As will be appreciated, the motherboard 1602 may be, for example, any printed circuit board (PCB), whether a main board, a daughterboard mounted on a main board, or the only board of system 1600, etc.

Depending on its applications, computing system 1600 may include one or more other components that may or may not be physically and electrically coupled to the motherboard 1602. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1600 may include one or more integrated circuit structures or devices configured in accordance with an example embodiment (e.g., a module including an integrated circuit device on a substrate, the substrate having one or more semiconductor devices with gate cuts present between adjacent pairs of semiconductor devices and one or more gate links between adjacent pairs of gate structures, as variously described herein). In some embodiments, multiple functions can be integrated into one or more chips (e.g., for instance, note that the communication chip 1606 can be part of or otherwise integrated into the processor 1604).

The communication chip 1606 enables wireless communications for the transfer of data to and from the computing system 1600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1606 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1600 may include a plurality of communication chips 1606. For instance, a first communication chip 1606 may be dedicated to shorter range wireless communications such as Wi-Fi and Bluetooth and a second communication chip 1606 may be dedicated to longer range wireless communications such as GPS, EDGE, GPRS, CDMA, WiMAX, LTE, Ev-DO, and others.

The processor 1604 of the computing system 1600 includes an integrated circuit die packaged within the processor 1604. In some embodiments, the integrated circuit die of the processor includes onboard circuitry that is implemented with one or more semiconductor devices as variously described herein. The term "processor" may refer to any device or portion of a device that processes, for instance, electronic data from registers and/or memory to transform that electronic data into other electronic data that may be stored in registers and/or memory.

The communication chip 1606 also may include an integrated circuit die packaged within the communication chip 1606. In accordance with some such example embodiments, the integrated circuit die of the communication chip includes one or more semiconductor devices as variously described herein. As will be appreciated in light of this disclosure, note that multi-standard wireless capability may be integrated directly into the processor 1604 (e.g., where functionality of any chips 1606 is integrated into processor 1604, rather than having separate communication chips). Further note that processor 1604 may be a chip set having such wireless capability. In short, any number of processor 1604 and/or communication chips 1606 can be used. Likewise, any one chip or chip set can have multiple functions integrated therein.

In various implementations, the computing system 1600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

It will be appreciated that in some embodiments, the various components of the computing system 1600 may be combined or integrated in a system-on-a-chip (SoC) architecture. In some embodiments, the components may be hardware components, firmware components, software components or any suitable combination of hardware, firmware or software.

Further Example Embodiments

The following examples pertain to further embodiments, from which numerous permutations and configurations will be apparent.

Example 1 is an integrated circuit that includes a first semiconductor device having a first semiconductor region extending in a first direction between a first source region and a first drain region and a second semiconductor device having a second semiconductor region extending in the first direction between a second source region and a second drain region. The second semiconductor device is spaced from the first semiconductor device in a second direction different from the first direction. The integrated circuit also includes a gate electrode around each of the first semiconductor region and the second semiconductor region, a dielectric wall between the first semiconductor device and the second semiconductor device, such that the gate electrode extends through a portion of the dielectric wall along the second direction, and a dielectric layer on a top surface of the gate electrode. The dielectric layer has a first thickness above the dielectric wall and a second thickness above the first semiconductor device or the second semiconductor device that is at least 1 nm different from the first thickness. The first and second thickness are measured in a third direction different from the first and second directions.

Example 2 includes the integrated circuit of Example 1, wherein the dielectric wall comprises a dielectric layer along one or more edges of the dielectric wall and a dielectric fill in a remaining volume of the dielectric wall.

Example 3 includes the integrated circuit of Example 2, wherein the dielectric layer comprises a low-K dielectric material.

Example 4 includes the integrated circuit of any one of Examples 1-3, wherein the first semiconductor region comprises a plurality of first semiconductor nanoribbons and the second semiconductor region comprises a plurality of second semiconductor nanoribbons.

Example 5 includes the integrated circuit of Example 4, wherein the plurality of first semiconductor nanoribbons and the plurality of second semiconductor nanoribbons comprise germanium, silicon, or a combination thereof.

Example 6 includes the integrated circuit of any one of Examples 1-5, further comprising a gate dielectric layer around the first semiconductor region and the second semiconductor region, such that the gate dielectric layer is between the first semiconductor region and the gate electrode, and is between the second semiconductor region and the gate electrode.

Example 7 includes the integrated circuit of Example 6, wherein the gate dielectric layer does not extend along any sidewall of the dielectric wall in the third direction.

Example 8 includes the integrated circuit of any one of Examples 1-7, wherein the first thickness of the dielectric layer is greater than the second thickness of the dielectric layer.

Example 9 includes the integrated circuit of any one of Examples 1-8, wherein the dielectric wall is a first dielectric wall and the integrated circuit further comprises a second dielectric wall between the first semiconductor device and a third semiconductor device, and a third dielectric wall between the second semiconductor device and a fourth semiconductor device. The second dielectric wall and the third dielectric wall extend through an entire thickness of the gate electrode.

Example 10 includes the integrated circuit of any one of Examples 1-9, wherein the dielectric wall extends in the first direction between the first source region and the second source region and between the first drain region and the second drain region.

Example 11 is a printed circuit board comprising the integrated circuit of any one of Examples 1-10.

Example 12 is an electronic device that includes a chip package comprising one or more dies. At least one of the one or more dies includes a first semiconductor device having a first semiconductor region extending in a first direction between a first source region and a first drain region, a second semiconductor device having a second semiconductor region extending in the first direction between a second source region and a second drain region with the second semiconductor device spaced from the first semiconductor device in a second direction different from the first direction, a first gate electrode around the first semiconductor region and a second gate electrode around the second semiconductor region, a gate cut comprising a dielectric material and between the first semiconductor device and the second semiconductor device such that the gate cut separates the first and second gate electrodes, a conductive bridge above the gate cut and extending from a sidewall of the first gate electrode to a sidewall of the second gate electrode, and a dielectric layer on a top surface of the gate electrode and on a top surface of the conductive bridge. The dielectric layer has a first thickness above the conductive bridge and a second thickness above the first or second gate electrode that is at least 2 nm different from the first thickness. The first and second thicknesses are measured in a third direction different from the first and second directions.

Example 13 includes the electronic device of Example 12, wherein the gate cut comprises a dielectric layer along one or more edges of the gate cut and a dielectric fill in a remaining volume of the gate cut.

Example 14 includes the electronic device of Example 13, wherein the dielectric layer comprises a low-K dielectric material.

Example 15 includes the electronic device of any one of Examples 12-14, wherein the first semiconductor region comprises a plurality of first semiconductor nanoribbons and the second semiconductor region comprises a plurality of second semiconductor nanoribbons.

Example 16 includes the electronic device of Example 15, wherein the plurality of first semiconductor nanoribbons and the plurality of second semiconductor nanoribbons comprise germanium, silicon, or a combination thereof.

Example 17 includes the electronic device of any one of Examples 12-16, further comprising a gate dielectric layer around the first semiconductor region and the second semiconductor region, such that the gate dielectric layer is between the first semiconductor region and the gate electrode and is between the second semiconductor region and the gate electrode.

Example 18 includes the electronic device of Example 17, wherein the gate dielectric layer does not extend along any sidewall of the gate cut in the third direction.

Example 19 includes the electronic device of any one of Examples 12-18, wherein the first thickness of the dielectric layer is greater than the second thickness of the dielectric layer.

Example 20 includes the electronic device of any one of Examples 12-19, wherein the gate cut is a first gate cut and the at least one of the one or more dies further comprises: a second gate cut between the first gate electrode and a third gate electrode with the second gate cut completely separating the first and third gate electrodes, and a third gate cut between the second gate electrode and a fourth gate electrode with the third gate cut completely separating the second and fourth gate electrodes.

Example 21 includes the electronic device of any one of Examples 12-20, wherein the gate cut extends in the first direction between the first source region and the second source region and between the first drain region and the second drain region.

Example 22 includes the electronic device of any one of Examples 12-21, further comprising a printed circuit board, wherein the chip package is coupled to the printed circuit board.

Example 23 is a method of forming an integrated circuit. The method includes forming a first fin comprising first semiconductor material and a second fin comprising second semiconductor material, the first and second fins extending above a substrate and each extending in a first direction; forming a gate electrode extending over the first fin and the second fin in a second direction different from the first direction; forming a first source region at a first end of the first fin and a first drain region at a second end of the first fin; forming a second source region at a first end of the second fin and a second drain region at a second end of the second fin; forming a dielectric layer over the gate electrode; forming a recess through the gate electrode between the first fin and the second fin, the recess further extending in the first direction between the first source region and the second source region and between the first drain region and the second drain region; forming a dielectric material within the recess; recessing a portion of the dielectric material within the recess between the first semiconductor material and the second semiconductor material; forming a conductive material over the dielectric material, the conductive material being within the recess and contacting the gate electrode; and forming a dielectric fill on the conductive material such that the dielectric fill contacts the dielectric layer.

Example 24 includes the method of Example 23, further comprising forming a gate dielectric layer around the first semiconductor material and the second semiconductor material before forming the gate electrode.

Example 25 includes the method of Example 23 or 24, wherein forming the recess comprises forming the recess through an entire thickness of the gate electrode.

Example 26 includes the method of any one of Examples 23-25, wherein forming the recess comprises forming the recess through an entire thickness of the dielectric layer.

Example 27 is an integrated circuit that includes a first semiconductor region extending in a first direction between a first source region and a first drain region and a second semiconductor region extending in the first direction between a second source region and a second drain region. The second semiconductor region is spaced from the first semiconductor region in a second direction different from the first direction. The integrated circuit also includes a first gate electrode around the first semiconductor region, a second gate electrode around the second semiconductor region, a dielectric wall between the first gate electrode and the second gate electrode, and a conductive bridge extending through a portion of the dielectric wall along the second direction and contacting sidewalls of the first gate electrode and the second gate electrode.

Example 28 includes the integrated circuit of Example 27, wherein the first gate electrode and the second gate electrode have a first width along the first direction and the conductive bridge has a second width along the first direction that is at least 2 nm less than the first width.

Example 29 includes the integrated circuit of Example 27 or 28, wherein the dielectric wall comprises a dielectric layer along one or more edges of the dielectric wall and a dielectric fill in a remaining volume of the dielectric wall.

Example 30 includes the integrated circuit of Example 29, wherein the dielectric layer comprises a low-K dielectric material.

Example 31 includes the integrated circuit of any one of Examples 27-30, wherein the first semiconductor region comprises a plurality of first semiconductor nanoribbons and the second semiconductor region comprises a plurality of second semiconductor nanoribbons.

Example 32 includes the integrated circuit of Example 31, wherein the plurality of first semiconductor nanoribbons and the plurality of second semiconductor nanoribbons comprise germanium, silicon, or a combination thereof.

Example 33 includes the integrated circuit of any one of Examples 27-32, further comprising a gate dielectric layer around the first semiconductor region and the second semiconductor region, such that the gate dielectric layer is between the first semiconductor region and the first gate electrode and is between the second semiconductor region and the second gate electrode.

Example 34 includes the integrated circuit of Example 33, wherein the dielectric wall passes through the gate dielectric layer, such that the dielectric layer abuts the dielectric wall but does not extend up a sidewall of the dielectric wall.

Example 35 includes the integrated circuit of any one of Examples 27-34, wherein the conductive bridge comprises a different conductive material than the first gate electrode and the second gate electrode.

Example 36 includes the integrated circuit of any one of Examples 27-35, wherein the conductive bridge comprises molybdenum.

Example 37 includes the integrated circuit of any one of Examples 27-36, wherein the dielectric wall is a first dielectric wall and the integrated circuit further comprises a second dielectric wall between the first semiconductor region and a third semiconductor region with the second dielectric wall extending along an entire thickness of the first gate electrode, and a third dielectric wall between the second semiconductor region and a fourth semiconductor region with the third dielectric wall extending along an entire thickness of the second gate electrode.

Example 38 is a printed circuit board comprising the integrated circuit of claim any one of Examples 27-37.

The foregoing description of the embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. An integrated circuit comprising:

a first semiconductor device having a first semiconductor region extending in a first direction between a first source region and a first drain region;

a second semiconductor device having a second semiconductor region extending in the first direction between a second source region and a second drain region, the second semiconductor device spaced from the first semiconductor device in a second direction different from the first direction;

a gate electrode around each of the first semiconductor region and the second semiconductor region;

a dielectric wall between the first semiconductor device and the second semiconductor device, such that the gate electrode extends through a portion of the dielectric wall along the second direction, wherein the dielectric wall extends in the first direction between the first source region and the second source region and between the first drain region and the second drain region; and a dielectric layer on a top surface of the gate electrode, wherein the dielectric layer has a first thickness above the dielectric wall and a second thickness above the first semiconductor device or the second semiconductor device that is at least 1 nm different from the first thickness, the first and second thicknesses being in a third direction different from the first and second directions.

2. The integrated circuit of claim 1, wherein the dielectric wall comprises a dielectric layer along one or more edges of the dielectric wall and a dielectric fill in a remaining volume of the dielectric wall.

3. The integrated circuit of claim 1, wherein the first semiconductor region comprises a plurality of first semiconductor nanoribbons and the second semiconductor region comprises a plurality of second semiconductor nanoribbons.

4. The integrated circuit of claim 1, further comprising a gate dielectric layer around the first semiconductor region and the second semiconductor region, such that the gate dielectric layer is between the first semiconductor region and the gate electrode, and is between the second semiconductor region and the gate electrode.

5. The integrated circuit of claim 4, wherein the gate dielectric layer does not extend along any sidewall of the dielectric wall in the third direction.

6. The integrated circuit of claim 1, wherein the first thickness of the dielectric layer is greater than the second thickness of the dielectric layer.

7. The integrated circuit of claim 1, wherein the dielectric wall is a first dielectric wall and the integrated circuit further comprises:

a second dielectric wall between the first semiconductor device and a third semiconductor device, the second dielectric wall extending through an entire thickness of the gate electrode; and a third dielectric wall between the second semiconductor device and a fourth semiconductor device, the third dielectric wall extending through an entire thickness of the gate electrode.

8. An electronic device, comprising:

a chip package comprising one or more dies, at least one of the one or more dies comprising a first semiconductor device having a first semiconductor region extending in a first direction between a first source region and a first drain region;

a second semiconductor device having a second semiconductor region extending in the first direction between a second source region and a second drain region, the second semiconductor device spaced from the first semiconductor device in a second direction different from the first direction;

a first gate electrode around the first semiconductor region and a second gate electrode around the second semiconductor region;

a gate cut between the first semiconductor device and the second semiconductor device and separating the first and second gate electrodes, the gate cut comprising dielectric material;

a conductive bridge above the gate cut and extending from a sidewall of the first gate electrode to a sidewall of the second gate electrode; and a dielectric layer on a top surface of the first or second gate electrode and on a top surface of the conductive bridge, wherein the dielectric layer has a first thickness above the conductive bridge and a second thickness above the first or second gate electrode that is at least 2 nm different from the first thickness, the first and second thicknesses being in a third direction different from the first and second directions.

9. The electronic device of claim 8, wherein the gate cut comprises a dielectric layer along one or more edges of the gate cut and a dielectric fill in a remaining volume of the gate cut.

10. The electronic device of claim 8, further comprising a gate dielectric layer around the first semiconductor region and the second semiconductor region, such that the gate dielectric layer is between the first semiconductor region and the first gate electrode and is between the second semiconductor region and the second gate electrode.

11. The electronic device of claim 10, wherein the gate dielectric layer does not extend along any sidewall of the gate cut in the third direction.

12. The electronic device of claim 8, wherein the first thickness of the dielectric layer is greater than the second thickness of the dielectric layer.

13. The electronic device of claim 8, wherein the gate cut extends in the first direction between the first source region and the second source region and between the first drain region and the second drain region.

14. An integrated circuit comprising:

a first semiconductor region extending in a first direction between a first source region and a first drain region;

a second semiconductor region extending in the first direction between a second source region and a second drain region, the second semiconductor region spaced from the first semiconductor region in a second direction different from the first direction;

a first gate electrode around the first semiconductor region;

a second gate electrode around the second semiconductor region;

a dielectric wall between the first gate electrode and the second gate electrode; and a conductive bridge extending through a portion of the dielectric wall along the second direction and contacting sidewalls of the first gate electrode and the second gate electrode, wherein the first gate electrode and the second gate electrode have a first width along the first direction and the conductive bridge has a second width along the first direction that is at least 2 nm less than the first width.

15. The integrated circuit of claim 14, wherein the dielectric wall comprises a dielectric layer along one or more edges of the dielectric wall and a dielectric fill in a remaining volume of the dielectric wall.

16. The integrated circuit of claim 15, wherein the dielectric layer comprises a low-K dielectric material.

17. The integrated circuit of claim 14, wherein the conductive bridge comprises a different conductive material than the first gate electrode and the second gate electrode.

18. The integrated circuit of claim 14, wherein the conductive bridge comprises molybdenum.

* * * * *